(12) United States Patent  
Reid et al.

(10) Patent No.: US 9,322,108 B2
(45) Date of Patent: Apr. 26, 2016

(54) PROCESS FOR THE ELECTROCHEMICAL DEPOSITION OF A SEMICONDUCTOR MATERIAL

(71) Applicant: University of Southampton, Southampton (GB)

(72) Inventors: Gillian Reid, Southampton (GB); Philip Nigel Bartlett, Southampton (GB); Andrew Lee Hector, Southampton (GB)

(73) Assignee: University of Southampton, Southampton (GB)

( * ) Notice: Subject to any disclaimer, the term of this patent is extended or adjusted under 35 U.S.C. 154(b) by 0 days.

(21) Appl. No.: 14/392,013

(22) PCT Filed: Jul. 24, 2013

(86) PCT No.: PCT/GB2013/000322
§ 371 (c)(1),
(2) Date: Jan. 23, 2015

(87) PCT Pub. No.: WO2014/016544
PCT Pub. Date: Jan. 30, 2014

(65) Prior Publication Data
US 2015/0329983 A1 Nov. 19, 2015

(30) Foreign Application Priority Data

Jul. 27, 2012 (GB) .................................. 1213589.3

(51) Int. Cl.
*C25D 3/00* (2006.01)
*C25D 3/02* (2006.01)
(Continued)

(52) U.S. Cl.
CPC .. *C25D 7/12* (2013.01); *C25D 3/02* (2013.01); *C25D 3/26* (2013.01); *C25D 3/30* (2013.01);

*C25D 3/32* (2013.01); *C25D 3/34* (2013.01); *C25D 3/36* (2013.01); *C25D 3/44* (2013.01); *C25D 3/54* (2013.01); *C25D 3/56* (2013.01); *C25D 3/60* (2013.01); *C25D 5/02* (2013.01); *C25D 5/18* (2013.01); *C25D 9/08* (2013.01); *H01L 21/02381* (2013.01); *H01L 21/02491* (2013.01); *H01L 21/02549* (2013.01); *H01L 21/02628* (2013.01); *H01L 45/06* (2013.01); *H01L 45/1253* (2013.01);
(Continued)

(58) Field of Classification Search
CPC .................................... C25D 3/54; C25D 3/56
USPC ................................................... 205/234–237
See application file for complete search history.

(56) References Cited

PUBLICATIONS

Bartlett et al. "Phase behavior and conductivity study of electrolytes in supercritical hydrofluorocarbons" Phys. Chem. Chem. Phys., 2011, p. 190-198. Published Nov. 12, 2010.*

(Continued)

*Primary Examiner* — Nicholas A Smith
*Assistant Examiner* — Brian W Cohen
(74) *Attorney, Agent, or Firm* — Iandiorio Teska & Coleman, LLP

(57) ABSTRACT

A process for the electrochemical deposition of a semiconductor material, which process comprises: (i) providing a non-aqueous solvent; (ii) providing at least one precursor salt which forms a source of the constituent elements within the semiconductor material to be deposited; and (iii) electrodepositing the semiconductor material onto an electrode substrate using the precursor salt in the non-aqueous solvent, characterized in that: (iv) the semiconductor material is a p-block or a post-transition metal semiconductor material containing at least one p-block element or post-transition metal; and (v) the non-aqueous solvent is a halocarbon non-aqueous solvent.

19 Claims, 37 Drawing Sheets

(51) Int. Cl.
| | |
|---|---|
| *C25D 7/12* | (2006.01) |
| *H01L 45/00* | (2006.01) |
| *C25D 5/02* | (2006.01) |
| *C25D 3/34* | (2006.01) |
| *C25D 3/32* | (2006.01) |
| *C25D 3/30* | (2006.01) |
| *C25D 3/26* | (2006.01) |
| *C25D 3/36* | (2006.01) |
| *C25D 3/60* | (2006.01) |
| *H01L 21/02* | (2006.01) |
| *C25D 3/44* | (2006.01) |
| *C25D 3/54* | (2006.01) |
| *C25D 3/56* | (2006.01) |
| *C25D 5/18* | (2006.01) |
| *C25D 9/08* | (2006.01) |

(52) U.S. Cl.
CPC ......... *H01L 45/144* (2013.01); *H01L 45/1608* (2013.01); *H01L 45/1683* (2013.01)

(56) References Cited

PUBLICATIONS

Azaceta et al., Electrochemical Deposition of ZnO in a Room Temperature Ionic Liquid: 1-Butyl-1-methylpyrrolidinium bis(trifluoromethane sulfonyl)imide, Electrochemistry Communications, 11 (2009), pp. 2184-2186.

Ke et al., "Electrodeposition of Germanium From Supercritical Fluids", Phys. Chem. Chem. Phys., 2012, 14, pp. 1517-1528.

Fritz et al., "A New Electrochemical Method for Selenization of Stacked CuIn Layers and Preparation of CuInSe$_2$ by Thermal Annealing", Thin Solid Films, 247 (1994) pp. 129-133.

* cited by examiner

PROCESS FOR THE ELECTROCHEMICAL DEPOSITION OF A SEMICONDUCTOR MATERIAL

This invention relates to a process for the electrochemical deposition of a semiconductor material.

Processes for the electrodeposition of a semiconductor material are well known. It is also known that the electrodeposited semiconductor material may be used in the production of electronic devices. Phase change random access memory devices are a strong contestant in the ongoing search for faster, more compact, data storage devices. The phase change random access memory devices are a potential competitor to flash drives currently in use. Semiconductor alloys containing bismuth and/or antimony with selenium and/or tellurium are important thermoelectric materials for harvesting low grade heat and the efficiency may be improved significantly through nanostructuring. A problem occurs with known processes in that it may not be possible to electrodeposit the semiconductor material on a sufficiently small scale to enable desired miniaturisation of phase change memory devices or thermoelectric semiconductor materials.

It is an aim of the present invention to reduce the above mentioned problem.

Accordingly, in one non-limiting embodiment of the present invention there is provided a process for the electrochemical deposition of a semiconductor material, which process comprises:
(i) providing a non-aqueous solvent;
(ii) providing at least one precursor salt which forms a source of the constituent elements within the semiconductor material to be deposited; and
(iii) electrodepositing the semiconductor material onto an electrode substrate using the precursor salt in the non-aqueous solvent,
characterised in that:
(iv) the semiconductor material is a p-block or a post-transition metal semiconductor material containing at least one p-block element or post-transition metal; and
(v) the non-aqueous solvent is a halocarbon non-aqueous solvent.

The process of the present invention is useful in the development and miniaturisation of memory storage devices, for example phase change memory storage devices. The process of the present invention may enable a distinct separation to be achieved between individual memory cells in phase change memory devices, for example, phase change random access memory devices. The separation of the individual memory cells may avoid corruption during write/re-write processes. The memory storage devices may be used to provide fast and compact data storage, and thus the memory storage devices may compete with and replace existing flash drives.

The process of the present invention may also be useful in the production of nanostructured thermoelectric devices or optical devices, for example waveguides and optical devices using optical metamaterials.

The process of the present invention may be one in which the halocarbon non-aqueous solvent, is a fluoroalkane, a chloroalkane or a bromoalkane.

The halocarbon non-aqueous solvent may be a fluoro-, chloro- or bromo-alkane, including for example dichloromethane, chloroform, difluoromethane, trifluoromethane, 1,1-dichloroethane, 1,2-dichloroethane, 1,1,1-trichloroethane or 1,1,2-trichloroethane. The halocarbon non-aqueous solvent may alternatively be a fluoro-, chloro- or bromo-benzene, for example, mono-, di- or tri-chlorobenzene, mono-, di- or tri-bromobenzene, or mono-, di- or tri-fluorobenzene. The halocarbon non-aqueous solvent may alternatively be a fluorotoluene, for example, $C_6H_5(CF_3)$ or $C_6H_4(CF_3)_2$, or o-, m- or p-fluorotoluene.

The precursor salt may be a halometallate anion salt. The halometallate anion may be a chlorometallate anion, a bromometallate anion, or an iodometallate anion.

The halometallate anion salt may have the general formula:

$$[\text{cation}]_x[M_zX_y]$$

where x=1, 2 or 3
z=1 and then y=3, 4, 5 or 6
z=2 and then y=8, 9 or 10
M=Al, Ga, In, Ge, Sn, Pb, As, Sb, Bi, Se or Te and
X=Cl, Br or I The above halometallate anion may be such that:
$[M_zX_y]=$
$[AlX_4]^-$
$[InX_4]^-$
$[GeX_5]^-$
$[SbX_4]^-$
$[BiX_4]^-$
$[SbCl_6]^-$
$[SeX_6]^{2-}$
$[TeX_6]^{2-}$
$[GaX_4]^-$
$[GeX_6]^{2-}$
$[GeX_3]^-$
$[SnX_6]^-$
$[SnX_5]^-$
$[SnX_3]^-$
$[PbX_3]^-$
$[PbX_6]^{2-}$
$[AsX_4]^-$
$[SbX_5]^{2-}$
$[SbX_6]^{3-}$
$[BiX_5]^{2-}$
$[BiX_6]^{3-}$
$[Sb_2X_8]^{2-}$
$[Bi_2X_8]^{2-}$
$[Se_2X_{10}]^{2-}$
$[Te_2X_{10}]^{2-}$
$[CdX_4]^{2-}$
$[CdX_5]^{3-}$
$[HgX_4]^{2-}$
$[HgX_5]^{2-}$
$[HgX_3]^-$ The precursor salt may be one in which the cation in the precursor salt contains a redox inactive cation. The redox inactive cation may be a quaternary ammonium cation having a group $[R_4N]^+$ where R=alkyl. In this case, R may be methyl, ethyl, propyl, butyl, pentyl, hexyl, benzyl, cyclopentyl, cyclohexyl, or mixtures thereof.

Alternatively, the precursor salt may be one in which the redox inactive cation in the precursor salt is imidazolium; alkyl substituted imidazolium, where alkyl is methyl, ethyl, propyl, butyl, pentyl, hexyl, benzyl, cyclopentyl, cyclohexyl, or mixtures thereof; pyrrolidinium; alkyl substituted pyrrolidinium where alkyl is methyl, ethyl, propyl, butyl, pentyl, hexyl, benzyl, cyclopentyl, cyclohexyl, or mixtures thereof; $[PPh_4]^+$; $[AsPh_4]^+$ or $[(PPh_3)_2N]^+$.

Preferably, the process of the present invention includes providing a supporting electrolyte salt for the non-aqueous solvent. However, if the solubility of the precursor salt is high enough, then the process of the present invention may be conducted without the supporting electrolyte salt. The supporting electrolyte salt may be used to maintain the required conductivity in the electrochemical solution.

Preferably, the supporting electrolyte salt is a redox inactive salt. The redox inactive salt may be in the form of a cation and an anion.

The anion in the supporting electrolyte salt may be a halide, tetrafluoroborate, hexafluorophosphate, a tetra-arylborate, a fluorinated tetra-aryl borate, tetra-alkoxyaluminate, or a fluorinated tetra-alkoxyaluminate.

The cation in the supporting electrolyte salt may be a redox inactive quaternary ammonium cation salt having a group $[R_4N]^+$ where R=alkyl. The alkyl may be methyl, ethyl, propyl, butyl, pentyl, hexyl, benzyl, cyclopentyl, cyclohexyl, or mixtures thereof.

The process may be one in which the electrodeposition is a continuous electrodeposition. Alternatively, the electrodeposition may be a pulsed electrodeposition.

The semiconductor material may be electrodeposited as at least one shaped structure. The shaped structure may be a pillar, a waveguide, a ring, a spherical particle, or a flat formation. Other shaped structures may be electrodeposited on differently shaped electrode substrates.

The process of the present invention may be one in which the electrode substrate is an electrode substrate having insulating pores, in which the shaped structure is a plurality of pillars, and in which the pillars are electrodeposited in the insulating pores.

Alternatively, the process of the present invention may be one in which the semiconductor material is electrodeposited all over the electrode substrate, the electrode substrate being a flat electrode substrate.

The semiconductor material is preferably a compound semiconductor containing two or more p-block elements. Other semiconductor materials may however be employed so that, for example, the semiconductor material may be a single semiconductor element or a semiconductor alloy.

Examples of suitable p-block elements may include gallium, indium, silicon, germanium, phosphorus, arsenic, antimony, bismuth, selenium or tellurium. Example of suitable post-transition metals may include cadmium or mercury. Within the Examples described below, the binary semiconductor indium antimonide is useful as an infrared detector, while antimony telluride is useful both as a phase change memory material and also as a thermoelectric material. The ternary germanium antimony telluride is an important phase change memory material.

In order to facilitate a full and complete understanding of the process of the present invention, reference will now be made, solely for the purposes of illustration, to the following Examples.

In the following Examples 1-16, there is described the electrodeposition of several individual p-block elements from Groups 13, 14 and 15 of the periodic table, binary semiconductor materials onto flat and patterned electrode substrates and ternary semiconductor materials. The Examples also show that the composition of the alloys, purity levels, morphology and density can be optimised using the system described.

EXAMPLE 1

Electrodeposition of an indium antimonide (InSb) semiconductor material.

This Example describes the electrodeposition of an indium antimonide semiconductor material from a solution composed of 10 mM [$^n$Bu$_4$N][InCl$_4$], 2 mM [$^n$Bu$_4$N][SbCl$_4$] and 100 mM $^n$Bu$_4$NCl in dichloromethane. The [$^n$Bu$_4$N][InCl$_4$] and [$^n$Bu$_4$N][SbCl$_4$] are two precursor salts which are used in tandem. The $^n$Bu$_4$NCl is a supporting electrolyte salt.

The electrochemical system was set up in a glove box to exclude moisture and oxygen contamination. A TIN coated silicon chip was used as the working electrode, i.e. the electrode substrate. The TIN coated silicon chip was sputtered with $SiO_2$ (except for a 4 mm diameter circle as an electrode area and a 5 mm$^2$ square as a contact area) to form a substrate with a well-defined conducting TiN electrode area. A Pt gauze was used as a counter electrode. An AgCl coated Ag wire immersed in a 100 mM solution of $^n$Bu$_4$NCl in dichloromethane was used as the reference electrode (denoted Ag/AgCl, 0.1 M Cl$^-$, CH$_2$Cl$_2$).

In order to determine the ideal conditions for the electrodeposition, cyclic voltammetry was performed on the electrochemical solution using a TiN electrode. The potential scan rate was 50 mV s$^{-1}$. The deposition potential was subsequently set to −1.2 V vs. Ag/AgCl (0.1 M Cl$^-$, CH$_2$Cl$_2$), where a peak was observed in the voltammogram.

Deposition times of less than 100 seconds led to pure, crystalline InSb.

This formed as a fine dark grey deposit of the semiconductor material on the electrode substrate. Characterisation by scanning electron microscopy showed that the electrodeposited semiconductor material was uniform and grainy, with grain sizes of several hundred nanometers. Energy dispersive X-ray measurements showed that the deposited material consisted of InSb with an elemental ratio of 1.02 In:1 Sb.

EXAMPLE 2

Electrodeposition of an Antimony Telluride Semiconductor Material onto a Flat TiN Electrode Antimony telluride was deposited onto flat TiN electrodes from a solution containing 10 mM [$^n$Bu$_4$N][SbCl$_4$], 10 mM [$^n$Bu$_4$N]$_2$[TeCl$_6$] and 100 mM $^n$Bu$_4$NCl in dichloromethane solution.

The electrochemical set-up was as described in Example 1.

As for Example 1, the deposition potential was determined by recording a cyclic voltammogram at 50 mV s$^{-1}$ on the electrochemical solution using a TiN coated silicon chip as the electrode. Electrodeposition was subsequently performed on a fresh electrode at −1.5 V vs Ag/AgCl (0.1 M Cl$^-$, CH$_2$Cl$_2$) for 1800 seconds.

Antimony telluride formed as a thick grey-black flaky deposit on the electrode substrate. Scanning electron microscopy showed that this semiconductor material was composed of grains with diameters ranging from hundreds of nanometers to a few micrometers. Characterisation by energy dispersive X-ray measurements suggested that this deposited semiconductor material had a SbTe$_3$ stoichiometry. X-Ray diffraction analysis revealed that the obtained material was predominantly amorphous.

EXAMPLE 3

Improving the Composition of the Antimony Telluride Semiconductor Material by Varying the Electrolyte Composition A SbTe composition of Sb$_1$Te$_1$ was identified as an initial target material. In order to achieve this, the electrolyte from Example 2 was modified. The electrolyte was prepared from 10 mM [$^n$Bu$_4$][SbCl$_4$], 5 mM and [$^n$Bu$_4$N]$_2$[TeCl$_6$] in 0.1 M [$^n$Bu$_4$N]Cl in dichloromethane. This electrolyte composition resulted in a stoichiometric amorphous SbTe compound at a deposition potential of −0.5 V vs Ag/AgCl (0.1 M Cl$^-$, CH$_2$Cl$_2$). The 1:1 Sb:Te ratio was confirmed by energy dispersive X-ray analysis. The stoichiometry of the SbTe compound could be controlled by changing the deposition potential.

EXAMPLE 4

Improving the Morphology of the Antimony Telluride Semiconductor Material by Varying the Deposition Potential Waveform The composition of the SbTe compound was predominantly controlled through the electrolyte composition as described in Example 3. The morphology of the antimony telluride was controlled through the electrodeposition waveform. Instead of only applying a constant electrodeposition potential as described in Example 3, this potential was preceded by a nucleation step, where the electrode was held at −1.5 V vs Ag/AgCl (0.1 M Cl$^-$, $CH_2Cl_2$) for 100 ms before it was switched to −0.5 V vs Ag/AgCl (0.1 M Cl$^-$, $CH_2Cl_2$) where the film was grown. The nucleation step allowed the formation of a layer of dense nuclei which were subsequently grown into films consisting of hundreds of nanometer-sized particles with a $Sb_1Te_{0.8}$ composition.

EXAMPLE 5

Electrodeposition of an Antimony Telluride Semiconductor Material onto a Patterned TiN Electrode The semiconductor material antimony telluride was electrodeposited onto a micropatterned TiN coated silicon wafer electrode, as described in Example 10, from an electrochemical solution containing 10 mM [$^n$Bu$_4$N][SbCl$_4$], 10 mM [$^n$Bu$_4$N]$_2$[TeCl$_6$] and 100 mM $^n$Bu$_4$NCl in dichloromethane.

The electrochemical system was as described in Example 1.

As described in Example 1, the electrodeposition potential was determined by recording a cyclic voltammogram with a TiN coated silicon wafer electrode. Electrodeposition was subsequently performed on the same electrode at −1.5 V vs Ag/AgCl (0.1 M Cl$^-$, $CH_2Cl_2$) for 900 seconds.

Scanning electron microscopy images showed that the antimony telluride semiconductor material had deposited into holes with diameters ranging for 100 μm down to 1 μm. The deposit only formed inside the holes on the conducting TiN surface, and not on the $SiO_2$ coated regions of the patterned electrode. Further down scaling is expected to be possible.

The adhesion between the electrodeposited antimony telluride semiconductor material and the TiN substrate is not very strong, allowing easy removal of individual pillars. A scanning electron micrograph of an individual pillar of the antimony telluride semiconductor material was taken.

Energy dispersive X-ray spectra of a larger area of electrodeposited antimony telluride semiconductor material suggested a similar composition to the one obtained in Example 2. The stoichiometry of this electrodeposited semiconductor material is $SbTe_3$.

EXAMPLE 6

Improving the Electrodeposition of an Antimony Telluride Semiconductor Material onto a Patterned TiN Electrode Using Adjusted Electrolyte Concentrations and Deposition Potential Waveforms The antimony telluride semiconductor material was electrodeposited onto a micropatterned TiN coated silicon wafer electrode, as described in Example 10, from an electrochemical solution containing 10 mM [$^n$Bu$_4$N][SbCl$_4$], 5 mM [$^n$Bu$_4$N]$_2$[TeCl$_6$] and 100 mM $^n$Bu$_4$NCl in dichloromethane.

The electrochemical set-up was as described in Example 1.

As described in Example 4, the electrodeposition was preceded by a nucleation step where the electrode was held at −1.5 V vs Ag/AgCl (0.1 M Cl$^-$, $CH_2Cl_2$) for 250 ms. Subsequently, the semiconductor material was grown at 0.5 V vs Ag/AgCl (0.1 M Cl$^-$, $CH_2Cl_2$) for 75 s.

Scanning electron microscopy images showed that the antimony telluride semiconductor material had deposited into holes with diameters ranging for 100 μm down to 2 μm. The deposit only formed inside the holes on the conducting TiN surface, and not on the $SiO_2$ coated regions of the patterned electrode. Further down-scaling is expected to be possible.

Energy dispersive X-ray spectra of the electrodeposited antimony telluride semiconductor material suggested a similar composition to the one obtained in Example 4. The stoichiometry of this electrodeposited semiconductor material is approximately $Sb_1Te_{0.7}$.

Microfocus X-ray diffraction measurements were performed on Beamline I18 at the Diamond Light Source, Didcot, Oxfordshire, UK, using X-rays of wavelength 0.738 Å with beam dimension of 2×4 μm and collected using a 4000× 2500 pixel CCD detector. Transmission measurements were performed through the substrate; background measurements were subtracted after collection on similar areas of substrate lacking deposited material. The microfocus X-ray diffraction measurements confirmed the presence of crystalline SbTe inside pores with diameters of down to 5 μm after annealing at 160° C. for 15 minutes.

EXAMPLE 7

This Example describes the preparation and characterisation of one of the halometallate precursor salts used for the electrodeposition of elemental indium, or of an indium-containing semiconductor material as described in Example 1.

[$^n$Bu$_4$N][InCl$_4$]: The preparation of this precursor salt was described in *Inorg. Chem.*, 1971, 10, 1907. A Schlenk tube was loaded with InCl$_3$ (0.447 g, 2.02×10$^{-3}$ mol) and $^n$Bu$_4$NCl (0.559 g, 2.01×10$^{-3}$ mol). With stirring, CH$_3$CN (30 mL) was added, giving a clear, colourless solution. After stirring at room temperature for approximately one hour, the solution was concentrated in vacuo to ca. 8 mL, layered with diethyl ether (40 mL) and stored at ca. −18° C. A large mass of colourless crystals formed overnight, and these were collected by filtration, washed with diethyl ether and dried in vacuo. Yield: 0.628 g, 63%. Anal. Calcd. for $C_{16}H_{36}Cl_4InN$: C, 38.5; H, 7.3; N, 2.8. Found: C, 38.4; H, 7.5; N, 2.9%. $^{115}$In NMR (CH$_3$CN/CD$_3$CN, 298 K): 451; (+ca. 1 mol. equiv. [$^n$Bu$_4$N]Cl): 318; (+ca. 10 mol. equiv. [$^n$Bu$_4$N]Cl): 251. IR (Nujol/cm$^{-1}$): 331. Raman (cm$^{-1}$): 326, 335.

The suitability of the compound for electrodeposition was tested by recording cyclic voltammograms on glassy carbon and TiN electrodes. The electrochemical set-up was as described in Example 1. The electrolyte was prepared from 10 mM [$^n$Bu$_4$N][InCl$_4$] and 0.1 M [$^n$Bu$_4$N]Cl in dichloromethane. The electrodeposition was subsequently performed at −1 V vs Ag/AgCl (0.1 M Cl$^-$, $CH_2Cl_2$) for 3600 s on glassy carbon and at −1.3 V vs Ag/AgCl (0.1 M Cl$^-$, $CH_2Cl_2$) for 3600 s on TiN. Scanning electron microscopy energy dispersive X-ray spectra and X-ray diffraction data confirmed the preparation of a pure indium film.

EXAMPLE 8

This Example describes the preparation and characterisation of one of the halometallate precursor salts used for the electrodeposition of antimony, or of metal antimonide semiconductor material as described in Example 1.

[$^n$Bu$_4$N][SbCl$_4$]: The preparation of this precursor salt was described in *Red Trav. Chim. Pays-Bas*, 1970, 89, 1297. A Schlenk tube was loaded with SbCl$_3$ (0.461 g, 2.02×10$^{-3}$ mol)

and "Bu$_4$NCl (0.559 g, 2.01×10$^{-3}$ mol). With stirring, CH$_2$Cl$_2$ (20 mL) was added, giving a clear, colourless solution. After stirring at room temperature for 30 min., the solution was concentrated in vacuo to ca. 10 mL, layered with hexane (20 mL) and stored at ca. −18° C. A large mass of colourless crystals appeared overnight. These were collected by filtration, washed with hexane and dried in vacuo. Yield: 0.977 g, 96%. Anal. Calcd. for C$_{16}$H$_{36}$Cl$_4$NSb: C, 38.0; H, 7.2; N, 2.8. Found: C, 38.0; H, 7.5; N, 2.8%. IR (Nujol/cm$^{-1}$): 269, 345. Raman (cm$^{-1}$): 254, 288, 345.

The suitability of the compound for electrodeposition was tested by recording cyclic voltammograms on glassy carbon and TiN electrodes. The electrochemical set-up was as described in Example 1. The electrolyte was prepared from 10 mM ["Bu$_4$N][SbCl$_4$] and 0.1 M ["Bu$_4$N]Cl in dichloromethane. The electrodeposition was subsequently performed at −0.75 V vs Ag/AgCl (0.1 M Cl$^-$, CH$_2$Cl$_2$) for 1800 s on glassy carbon and at −1.2 V vs Ag/AgCl (0.1 M Cl$^-$, CH$_2$Cl$_2$) for 1800 s on TiN. Scanning electron microscopy energy dispersive X-ray spectra and X-ray diffraction data confirmed the preparation of a pure antimony film.

EXAMPLE 9

This Example describes the preparation and characterisation of one of the halometallate precursor salts used for the electrodeposition of tellurium, or of a metal telluride semiconductor material as described in Example 2 and Example 3.

["Bu$_4$N]$_2$[TeCl$_6$]: The preparation of this precursor salt was as described in *J. Am. Chem. Soc.*, 1970, 92, 307. A Schlenk tube was loaded with TeCl$_4$ (0.269 g, 9.98×10$^{-4}$ mol) and "Bu$_4$NCl (0.559 g, 2.01×10$^{-3}$ mol). With stirring, CH$_2$Cl$_2$ (40 mL) was added, giving a cloudy yellow solution. This was stirred at room temperature for ca. 1 hour, and then filtered. The clear yellow filtrate was concentrated in vacuo to ca. 5 mL, layered with diethyl ether (10 mL) and stored at ca. −18° C. A solid yellow mass formed overnight, which was collected by filtration, washed with diethyl ether and dried in vacuo. Yield: 0.694 g, 84%. Anal. Calcd. for C$_{32}$H$_{72}$Cl$_6$N$_2$Te: C, 46.6; H, 8.8; N, 3.4. Found: C, 46.4; H, 8.7; N, 3.5%. $^{125}$Te{$^1$H} NMR (CH$_2$Cl$_2$/CD$_2$Cl$_2$, 298 K): 1324. IR (Nujol/cm$^{-1}$): 223. Raman (cm$^{-1}$): 242, 283.

The suitability of the compound for electrodeposition was tested by recording cyclic voltammograms on glassy carbon and TiN electrodes. The electrochemical set-up was as described in Example 1. The electrolyte was prepared from 10 mM ["Bu$_4$N]$_2$[TeCl$_6$] and 0.1 M ["Bu$_4$N]Cl in dichloromethane. The electrodeposition was subsequently performed at −0.4 V vs Ag/AgCl (0.1 M Cl$^-$, CH$_2$Cl$_2$) for 1800 s on glassy carbon and at −0.8 V vs Ag/AgCl (0.1 M Cl$^-$, CH$_2$Cl$_2$) for 1800 s on TiN. Scanning electron microscopy energy dispersive X-ray spectra and X-ray diffraction data confirmed the preparation of a pure tellurium film.

EXAMPLE 10

Patterned Electrode Preparation

This Example describes the preparation of the patterned TiN/SiO$_2$ electrodes onto which the semiconductor materials were electrodeposited. TiN films with a thickness of 100 nm were deposited on a p-type Si (100) wafer by the medium frequency magnetron sputtering method at room temperature (type: Leybold HELIOS Pro). The films were deposited under a Ti (99.99% purity) target with a DC power of 3000 W in a N$_2$/Ar atmosphere. The N$_2$ and Ar flow rates were maintained at 30 and 35 sccm, respectively. A high drive speed of 180 rpm was applied to enhance the film uniformity. The deposition rate was found to be 0.161 nm s$^{-1}$. SiO$_2$ films with a thickness of 1 μm were also formed by the medium frequency magnetron sputtering method using a pure Si (99.99% purity) target with a DC power of 2000 W in an O$_2$/Ar atmosphere. The O$_2$ and Ar flow rates were maintained at 20 sccm and 40 sccm, respectively. With the same drive speed of 180 rpm, the deposition rate was 0.3 nm s$^{-1}$. The patterned samples were fabricated via a photolithographic process followed by reactive-ion etching of SiO$_2$. The pattern was pre-designed on a mask with template hole-sizes ranging from 1 μm to 100 μm. The photolithography was carried out using an EVG 620 TB with a positive resist S1813. The etching was performed by a RIE80+ with CHF$_3$ and Ar. The etching rate was found to be 22 nm s$^{-1}$.

EXAMPLE 11

This Example describes the preparation and characterisation of one of the halometallate precursor salts used for the electrodeposition of elemental bismuth.

["Bu$_4$N][BiCl$_4$]: The preparation of this precursor salt was as described in *Chem. Commun.*, 1968, 1356-1358 and *J. Chem. Soc. A*, 1970, 326-329. A Schlenk tube was loaded with BiCl$_3$ (0.319 g, 1.01×10$^{-3}$ mol) and ["Bu$_4$N]Cl (0.280 g, 1.01×10$^{-3}$ mol). With stirring, CH$_3$CN (20 mL) was added, giving a colourless solution. After stirring at room temperature for approximately 2 hours, the mixture was concentrated in vacuo to ca. 5 mL, layered with diethyl ether and stored at ca. ~18° C. A colourless, microcrystalline solid formed over a period of a few days. This was collected by filtration, washed with diethyl ether and dried in vacuo. Yield: 0.403 g (68%). Anal. Calcd. for C$_{16}$H$_{36}$BiCl$_4$N: C, 32.3; H, 6.1; N, 2.4. Found: C, 33.1; H, 6.0; N, 2.5%. IR (Nujol/cm$^{-1}$): 256, 287. Raman (cm$^{-1}$): 254, 289.

The suitability of the compound for electrodeposition was tested by recording cyclic voltammograms on glassy carbon and TiN electrodes. The electrochemical set-up was as described in Example 1. The electrolyte was prepared from 10 mM ["Bu$_4$N][BiCl$_4$] and 0.1 M ["Bu$_4$N]Cl in dichloromethane. The electrodeposition was subsequently performed at −0.59 V vs Ag/AgCl (0.1 M Cl$^-$, CH$_2$Cl$_2$) for 1800 s on glassy carbon and at −0.97 V vs Ag/AgCl (0.1 M Cl$^-$, CH$_2$Cl$_2$) for 1800 s on TiN. Scanning electron microscopy energy dispersive X-ray spectra and X-ray diffraction data confirmed the preparation of a pure bismuth film.

EXAMPLE 12

This Example describes the preparation and characterisation of one of the halometallate precursor salts used for the electrodeposition of elemental selenium.

["Bu$_4$N]$_2$[SeCl$_6$]: A Schlenk tube was loaded with SeCl$_4$ (0.219 g, 9.92×10$^{-4}$ mol) and ["Bu$_4$N]Cl (0.556 g, 2.00×10$^{-3}$ mol). With stirring, tetrahydrofuran (20 mL) was added, giving an almost clear yellow solution which rapidly deposited a large amount of a light yellow solid. This was collected by filtration, washed with a small amount of tetrahydrofuran and dried in vacuo. Yield: 0.610 g (79%). Anal. Calcd. for C$_{32}$H$_{72}$Cl$_6$N$_2$Se: C, 49.5; H, 9.4; N, 3.6. Found: C, 49.7; H, 9.8; N, 3.7%. $^{77}$Se NMR (CH$_2$Cl$_2$/CD$_2$Cl$_2$, 298 K): δ=881. Raman (cm$^{-1}$): 236, 284.

The suitability of the compound for electrodeposition was tested by recording cyclic voltammograms on glassy carbon and TiN electrodes. The electrochemical set-up was as described in Example 1. The electrolyte was prepared from 10 mM ["Bu$_4$N]$_2$[SeCl$_6$] and 0.1 M ["Bu$_4$N]Cl in dichloromethane. The electrodeposition was subsequently performed at −1 V vs Ag/AgCl (0.1 M Cl⁻, CH$_2$Cl$_2$) for 57600 s on glassy carbon and at −1 V vs Ag/AgCl (0.1 M Cl⁻, CH$_2$Cl$_2$) for 3600 s on TiN. Scanning electron microscopy energy dispersive X-ray spectra and X-ray diffraction data confirmed the preparation of a pure selenium film.

EXAMPLE 13

This Example describes the preparation and characterisation of one of the halometallate precursor salts used for the electrodeposition of germanium to produce alloys including germanium antimony telluride.

["Bu$_4$N][GeCl$_5$]: The preparation of this precursor salt was as described in *J. Chem. Soc.* (A), 1967, 712-718. GeCl$_4$ (0.295 g, 1.38×10³ mol) and ["Bu$_4$N]Cl (0.381 g, 1.37×10³ mol) were loaded into a Schlenk tube. CH$_2$Cl$_2$ (20 cm³) was added, giving a clear, colourless solution. This was stirred magnetically at room temperature for one hour, and then the solution was concentrated in vacuo to approximately half of the original volume and layered with diethyl ether (40 cm³). The mixture was stored at ca. −18° C., and large colourless crystals appeared over a period of two days. These were collected by filtration, washed with diethyl ether (20 cm³) and dried in vacuo. Yield: 0.486 g, 72%. Anal. Calc. for C$_{16}$H$_{36}$NCl$_5$Ge (%): C, 39.03; H, 7.37; N, 2.84%. Found: C, 38.02; H, 7.29; N, 2.88. Raman (cm⁻¹): 238(w), 349(s), 405 (vw).

EXAMPLE 14

This Example describes the preparation and characterisation of one of the halometallate precursor salts used for the electrodeposition of elemental germanium.

["Bu$_4$N][GeCl$_3$]: The preparation of this precursor salt was analogous to that described for [NEt$_4$][GeCl$_3$] described in *Inorg. Synth.*, 1974, 15, 222-225, by reaction of GeCl$_4$, H$_3$PO$_2$ and ["Bu$_4$N]Cl in aqueous HCl. The crude product was recrystallised from ethanol and dried for a prolonged period in vacuo. Yield: 60%. Anal. Calc. for C$_{16}$H$_{36}$NCl$_3$Ge (%): C, 45.48; H, 8.61; N, 3.32. Found: C, 45.47; H, 8.70; N, 3.35%. IR (Nujol/cm⁻¹): 270, 326.

The suitability of the compound for electrodeposition was tested by recording cyclic voltammograms on glassy carbon and TiN electrodes. The electrochemical set-up was as described in Example 1. The electrolyte was prepared from 10 mM ["Bu$_4$N][GeCl$_3$] and 0.1 M ["Bu$_4$N]Cl in dichloromethane. The electrodeposition was subsequently performed at −1.4 V vs Ag/AgCl (0.1 M Cl⁻, CH$_2$Cl$_2$) for 3600 s on glassy carbon and at −1.4 V vs Ag/AgCl (0.1 M Cl⁻, CH$_2$Cl$_2$) for 7200 s on TiN. On both electrode materials the deposition was self-limiting and film growth stopped after approximately 10 minutes. Analysis of the Ge film by scanning electron microscopy, energy dispersive X-ray spectra and X-ray diffraction data after annealing in N$_2$ at 600° C. for 45 mins. confirmed the preparation of a germanium film.

EXAMPLE 15

Electrodeposition of a Germanium Antimony Telluride Ternary Semiconductor Material onto a Flat TiN Electrode A ternary germanium antimony telluride, GeSbTe, phase change semiconductor material was prepared by electrodeposition using the same approach as described in Example 3. The electrolyte was prepared from 10 mM ["Bu$_4$N][GeCl$_5$], 10 mM ["Bu$_4$N][SbCl$_4$], 5 mM ["Bu$_4$N]$_2$[TeCl$_6$] and 0.1 M ["Bu$_4$N]Cl in dichloromethane. The electrodeposition conditions were evaluated from cyclic voltammograms and a range of deposition potentials were evaluated to obtain a variety of different GeSbTe stoichiometries. The as-deposited material was formed as homogeneous amorphous films made from spherical particles with diameters of less than a micrometer.

EXAMPLE 16

Electrodeposition of a Germanium Antimony Telluride Ternary Semiconductor Material onto a Patterned TiN Electrode A ternary germanium antimony telluride, GeSbTe, phase change semiconductor material was also formed within micropatterned electrode substrates. The same deposition conditions as described in Example 15 were used.

Scanning electron microscopy and energy dispersive X-ray analysis suggested the films were made from the ternary compound.

X-ray diffraction before and after annealing also supported the formation of crystalline germanium antimony telluride.

In order to further illustrate the present invention, reference will now be made to the following drawings in which.

Figure 34:
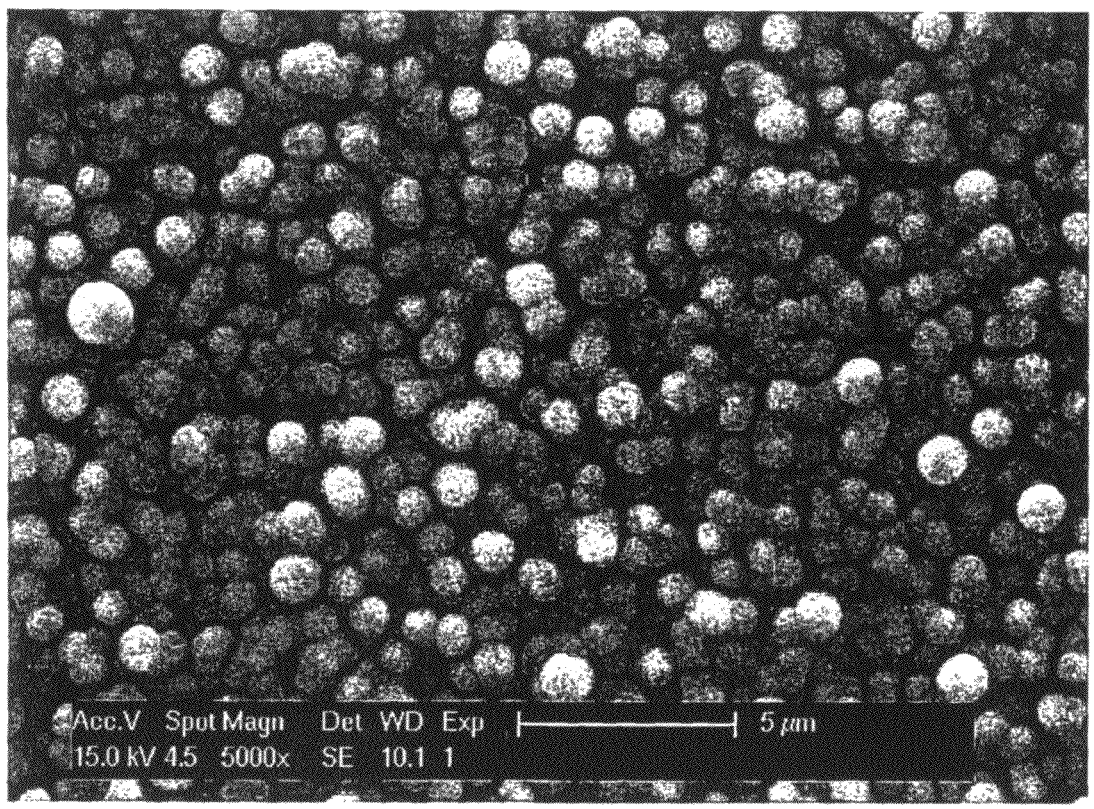
FIG. 34 shows the scanning electron micrograph of the ternary germanium antimony telluride semiconductor material electrodeposited at −1.75 V vs Ag/AgCl (0.1 M $CH_2Cl_2$) for 120 s as described in Example 15.
Figure 35:
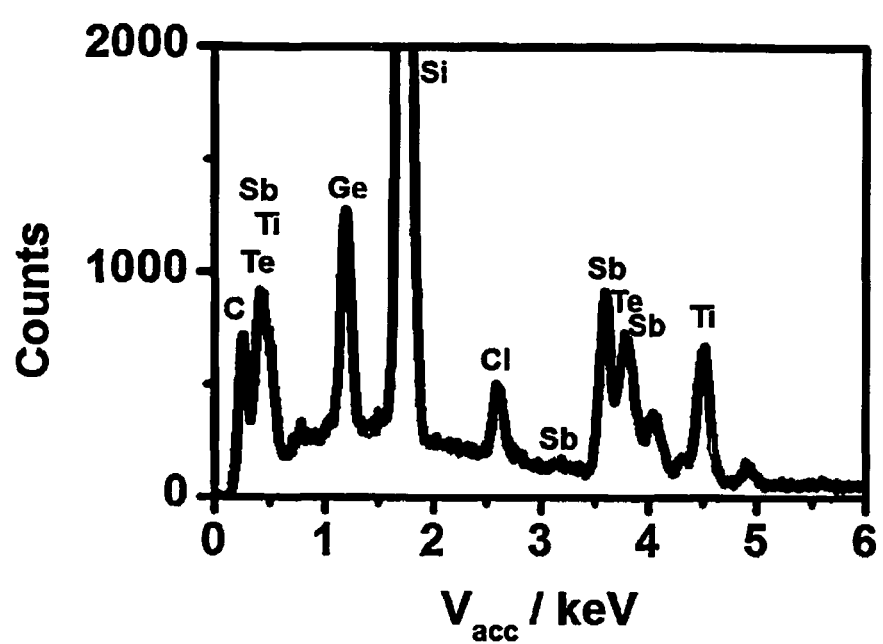
FIG. 35 shows the energy dispersive X-ray analysis of the ternary germanium antimony telluride semiconductor material electrodeposited shown in FIG. 32 as described in Example 15.
Figure 36:
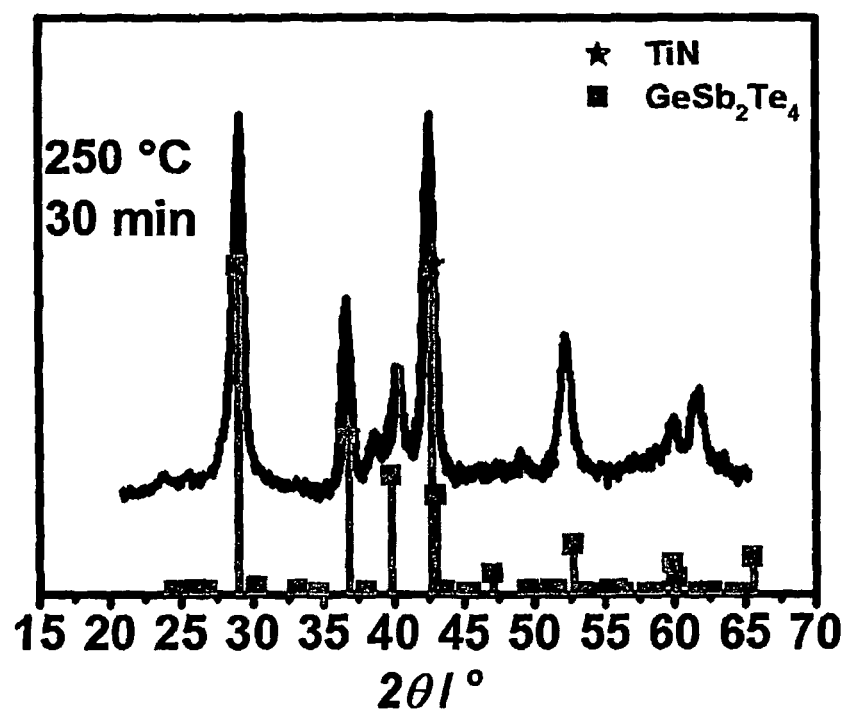
Figure 37:
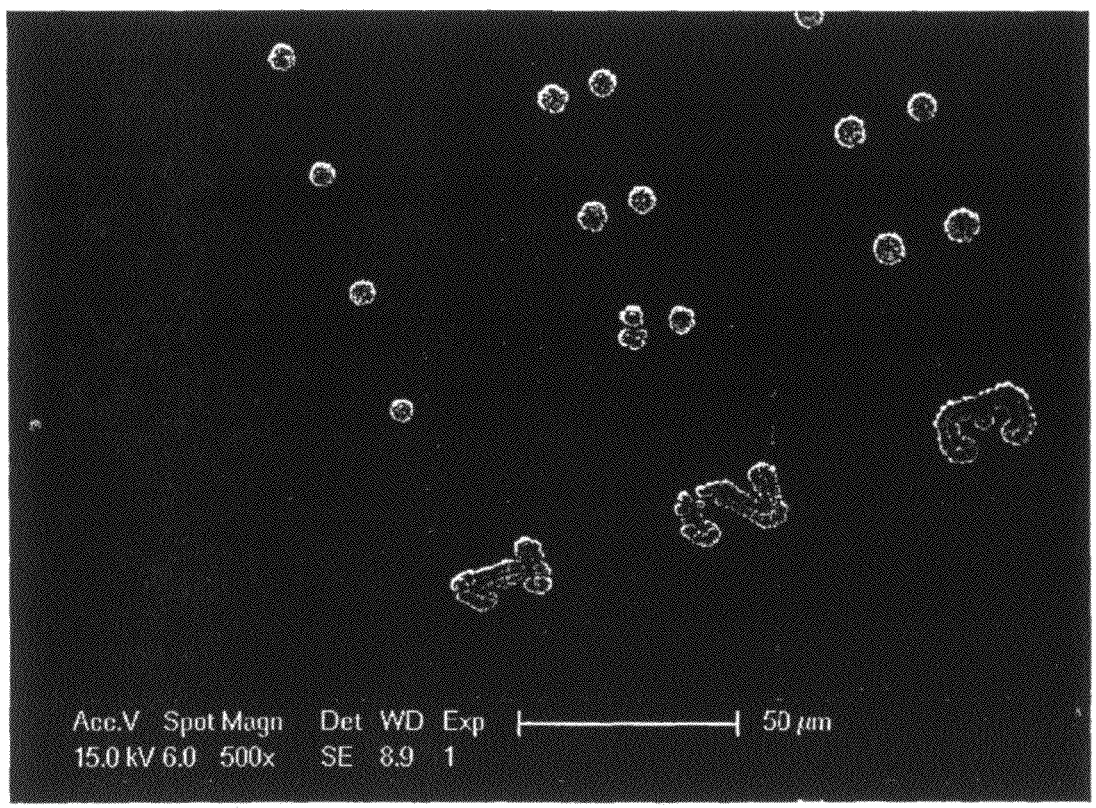

FIG. 36 shows the X-ray diffraction pattern of the ternary germanium antimony telluride semiconductor material electrodeposited shown in FIGS. 34 and 35 as described in Example 15 after annealing at 250° C. for 30 min; and FIG. 37 shows the scanning electron micrograph of the ternary germanium antimony telluride semiconductor material electrodeposited into pores with 1-3 μm diameter as described in Example 16.

Figure 1:
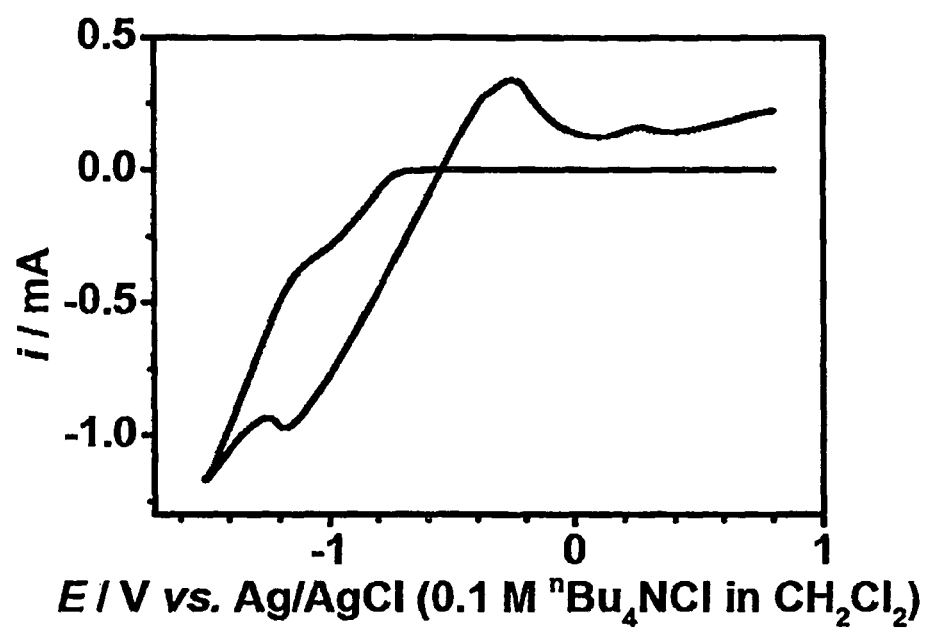
FIG. 1 shows a cyclic voltammogram recorded on a TiN electrode of the electrochemical solution containing the precursor salts and supporting electrolyte dissolved in CH$_2$Cl$_2$ for the InSb electrodeposition, corresponding to Example 1.
Figure 2:
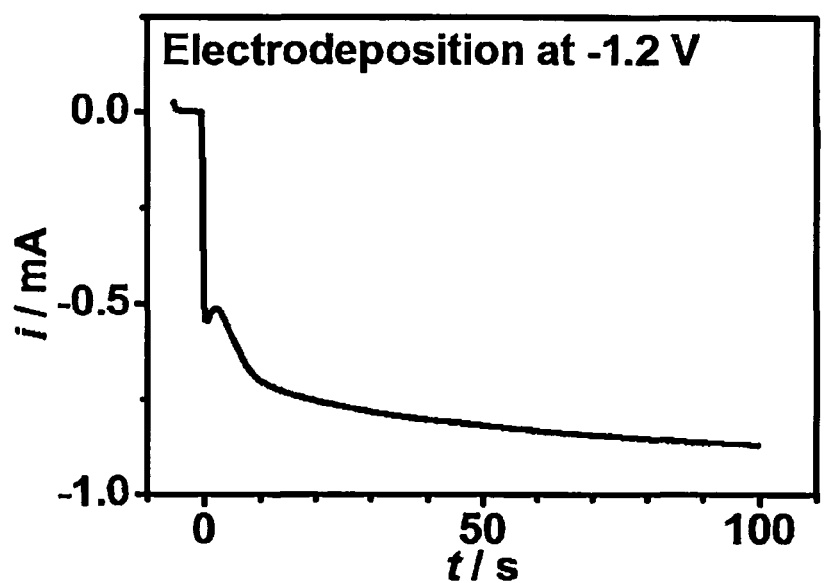
FIG. 2 shows a chronoamperometric curve recorded on a TiN electrode of the electrochemical solution containing the precursor salts and supporting electrolyte salt dissolved in CH$_2$Cl$_2$ for the InSb electrodeposition corresponding to Example 1.

Referring to the drawings, FIG. 1 shows that the electrochemical solution for the deposition of indium antimonide semiconductor material described in Example 1 has its reduction peak at −1.2 V vs Ag/AgCl (0.1 M $CH_2Cl_2$). On this basis, the chromoamperometry for this system, shown in FIG. 2, was also performed at −1.2 V vs Ag/AgCl (0.1 M Cl$^-$, $CH_2Cl_2$) for 100 s, allowing significant charge to pass.

Figure 3:
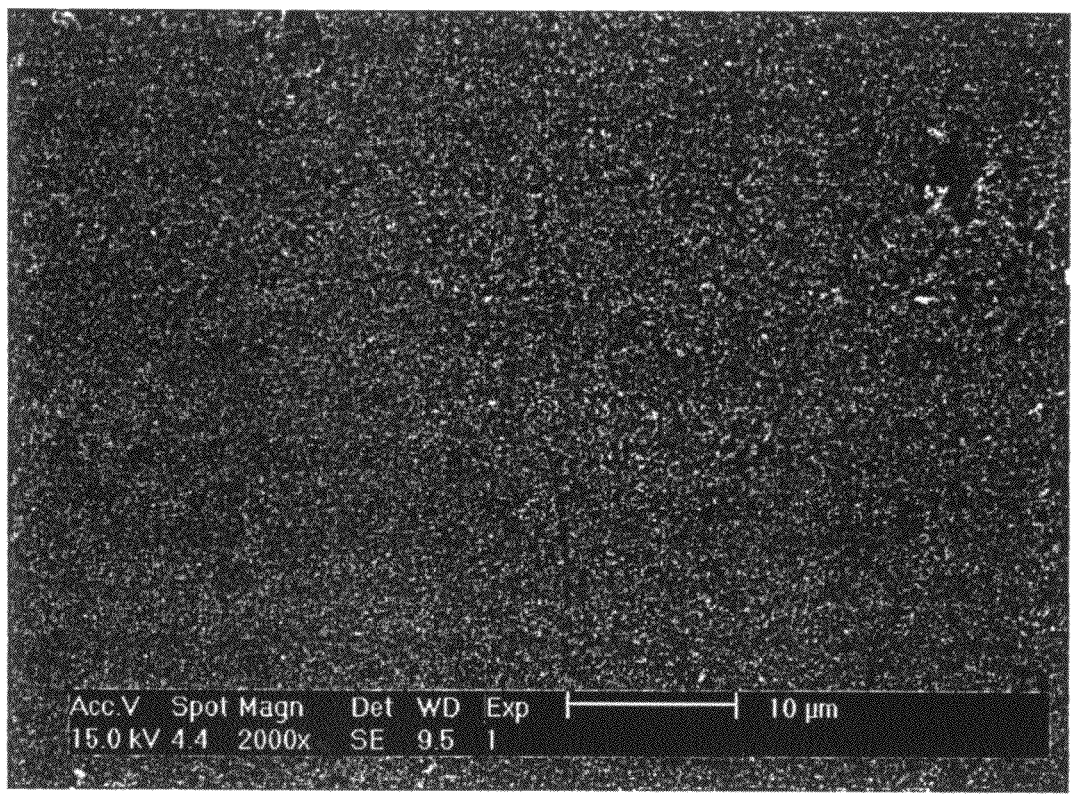
FIG. 3 shows a 2000× magnification of the electrodeposited InSb semiconductor material described in Example 1.
Figure 4:
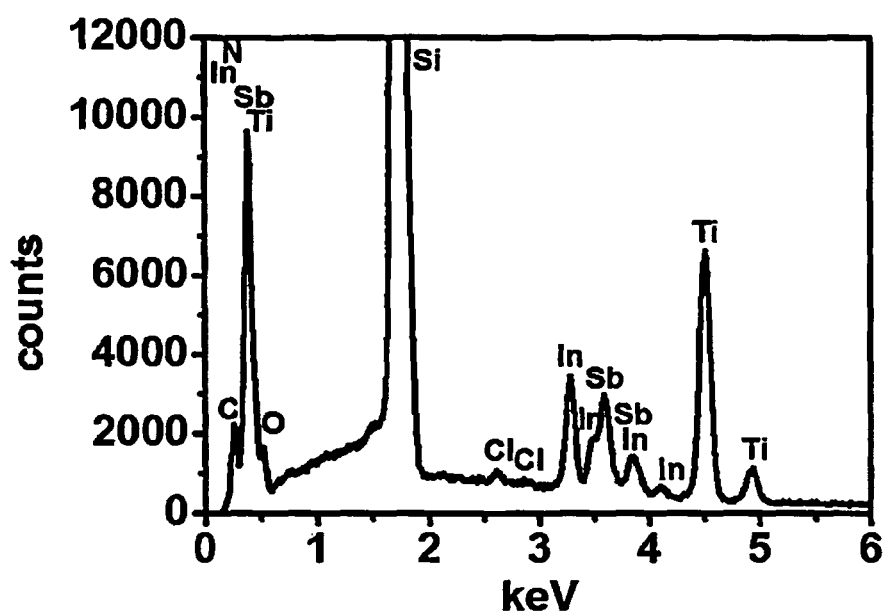
FIG. 4 shows a magnified section of the energy dispersive X-ray spectrum of the InSb semiconductor material corresponding to Example 1.

In FIG. 3, a homogeneous film with grains of a few 100 nm is visible on the electrode, and FIG. 4 shows that this electrodeposited material contains both In and Sb, in addition to the peaks for Si, Ti and N which are due to the electrode substrate. It also shows that the Cl content of the film is low.

Figure 5:
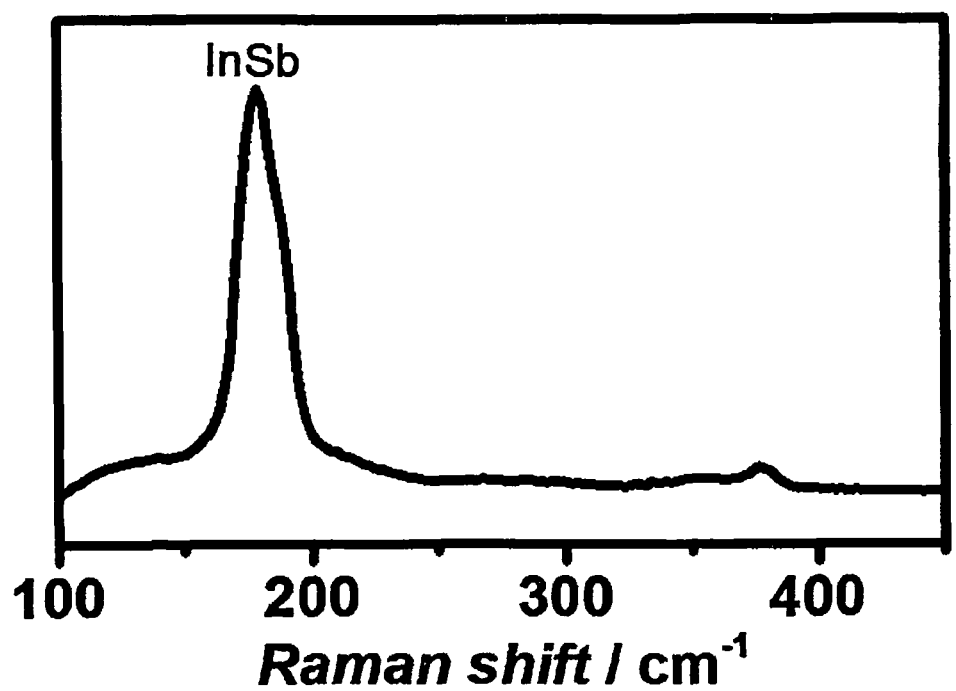
FIG. 5 shows a Raman spectrum of the InSb semiconductor material deposited corresponding to Example 1.
Figure 6:
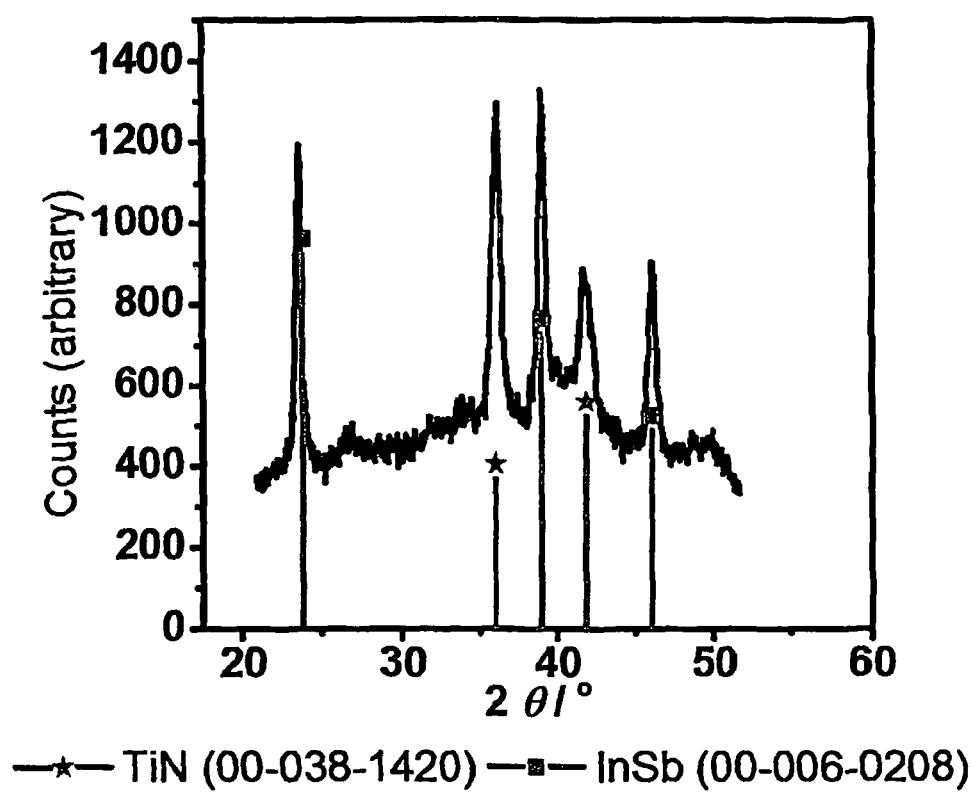
FIG. 6 shows an X-ray diffraction pattern of the semiconductor material described in Example 1.

The Raman spectrum shown in FIG. 5 is consistent with the electrodeposited material formed as described in Example 1 being indium antimonide, InSb. This is strong evidence that combining two of the halometallate reagents does allow electrodeposition of a binary semiconductor material, Further, referring to FIG. 6, the X-ray diffraction pattern of the material shows peaks consistent with crystalline InSb, as well as peaks from the TiN substrate.

Figure 7:
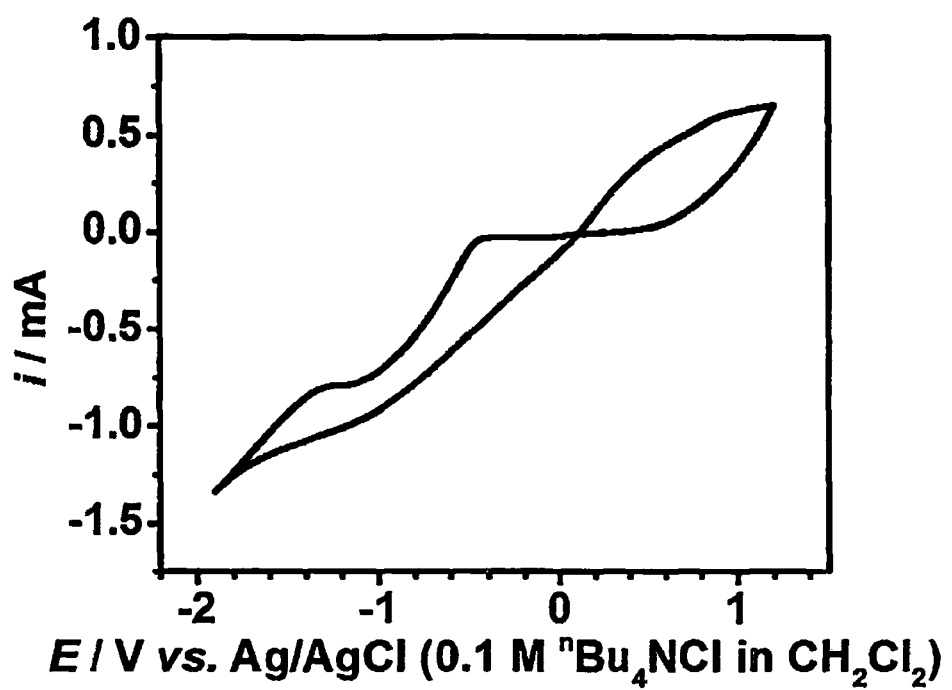
FIG. 7 shows a cyclic voltammogram recorded on a TiN electrode from the electrochemical solution containing the precursor salts and supporting electrolyte salt dissolved in CH$_2$Cl$_2$ for the antimony telluride electrodeposited according to the description in Example 2.
Figure 8:
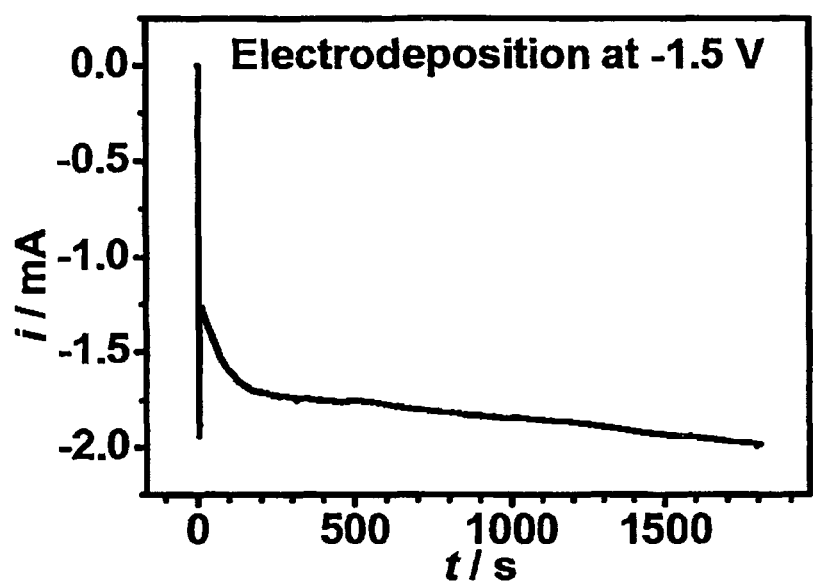
FIG. 8 shows a chronoamperometric curve recorded on a TiN electrode of the electrochemical solution containing the precursor salts and supporting electrolyte salt dissolved in CH$_2$Cl$_2$ for the antimony telluride electrodeposited according to the description in Example 2.
Figure 9:
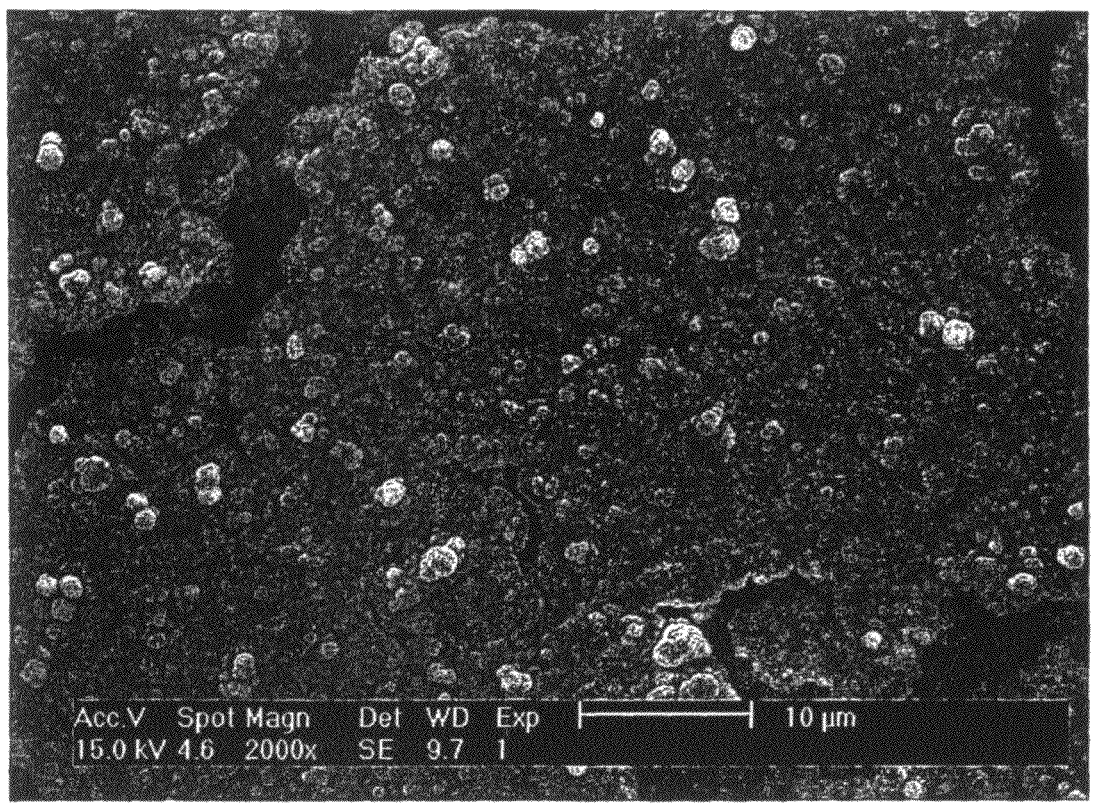
FIG. 9 shows a 2000× magnification of the electrodeposited antimony telluride semiconductor material described in Example 2.
Figure 10:
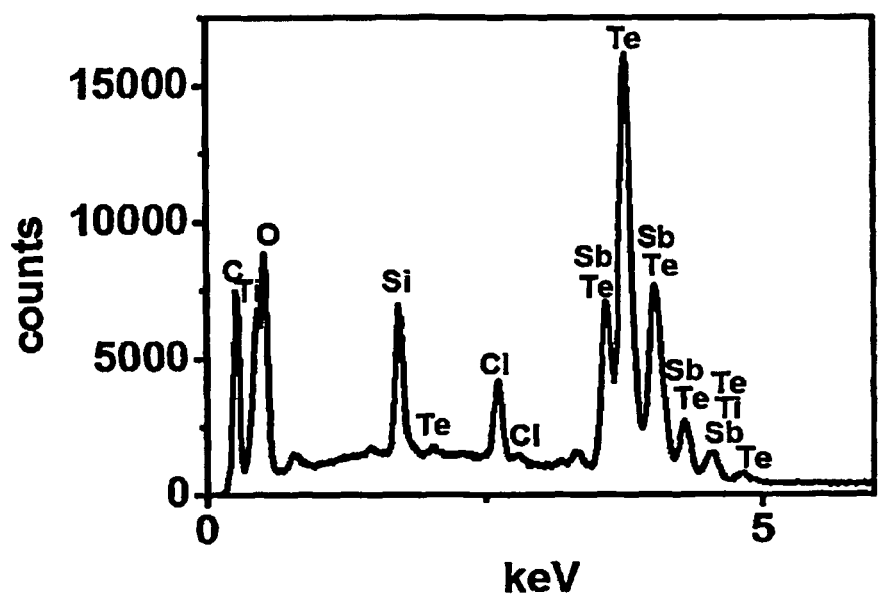
FIG. 10 shows the energy dispersive X-ray spectrum of the electrodeposited antimony telluride semiconductor material shown in FIG. 9, and corresponding to Example 2.

Referring to FIG. 7, the electrochemical solution described in Example 2 shows an ill-defined reduction at around −1.5 V vs Ag/AgCl (0.1 M Cl$^-$, $CH_2Cl_2$). As shown in FIG. 8, the chronoamperometry was then performed at −1.5 V vs Ag/AgCl (0.1 M Cl$^-$, $CH_2Cl_2$) for 1800 s, and the scanning electron micrograph shown in FIG. 9 shows that the electrodeposited material generally covers the electrode well, although its morphology is rather ill-defined with irregular grain sizes. Referring to FIG. 10, it can be seen that the electrodeposited material formed as described in Example 2 contains both Sb and Te, suggesting that both elements are co-deposited in the process described in Example 2. Peaks from the electrode substrate are also evident, as well as Cl and C, probably arising from supporting electrolyte, [$^nBu_4N$]Cl, trapped in the quite low density (highly porous) deposit.

Figure 11:
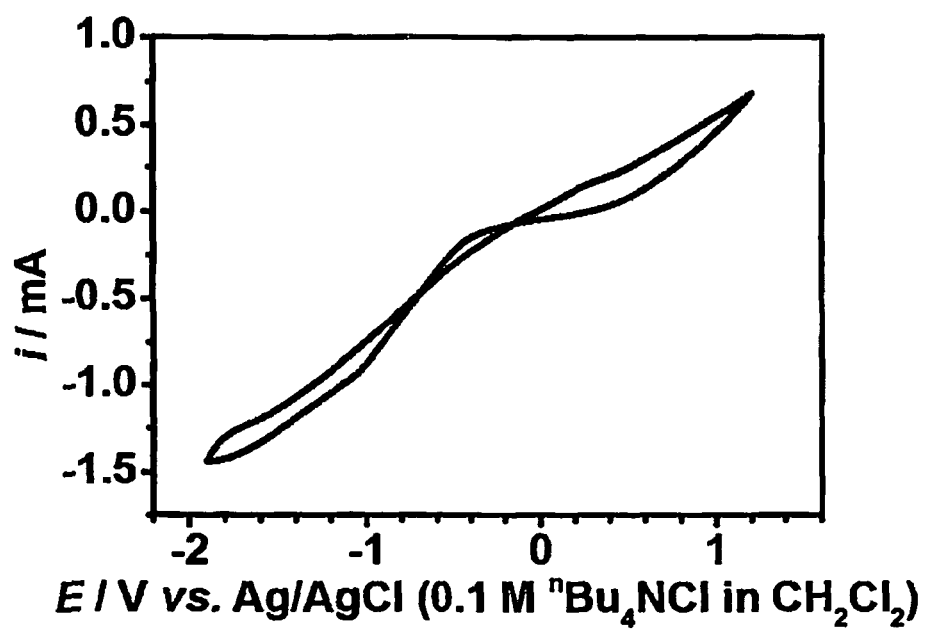
FIG. 11 shows a cyclic voltammogram recorded on a TIN electrode from the electrochemical solution containing the precursor salts and supporting electrolyte salt dissolved in CH$_2$Cl$_2$ for the electrodeposition of antimony telluride as described in Example 3.
Figure 12:
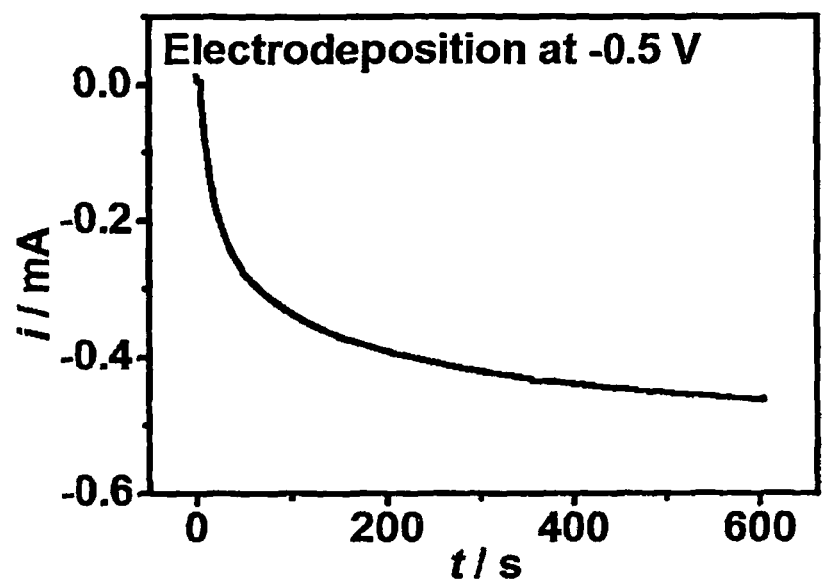
FIG. 12 shows a chronoamperometric curve recorded on a TiN electrode of the electrochemical solution containing the precursor salts and supporting electrolyte salt dissolved in CH$_2$Cl$_2$ for the antimony telluride electrodeposition as described in Example 3.
Figure 13:
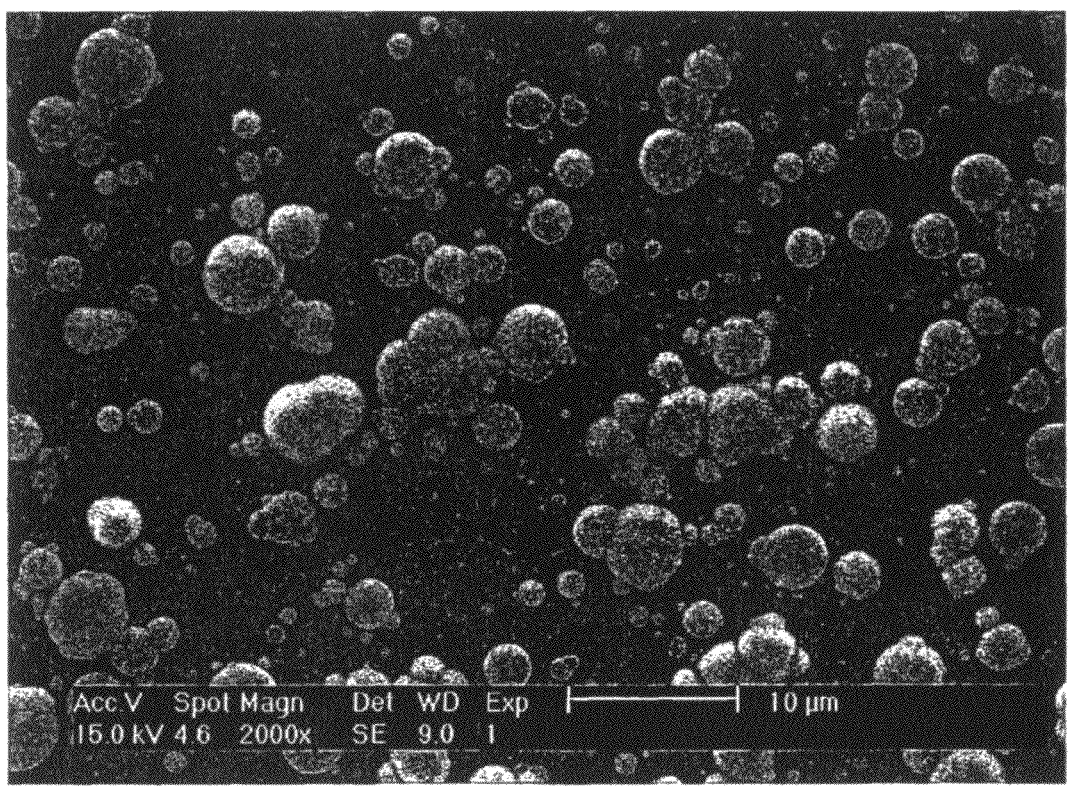
FIG. 13 shows a 2000× magnification of the electrodeposited antimony telluride semiconductor material described in Example 3.

FIG. 11 shows the cyclic voltammogram measured on a TiN electrolyte from the electrochemical solution used to deposit the antimony telluride in which the relative concentrations of the two halometallate salts were adjusted in order to achieve a 1:1 ratio of antimony:tellurium in the electrodeposited material, as described in Example 3. The chronoamperogram for this modified electrolyte solution is shown in FIG. 12. Referring to FIG. 13, it can be seen from the scanning electron micrograph that the antimony telluride material electrodeposited forms quite isolated globular particles on the electrode surface using the electrodeposition conditions as described in Example 3.

Figure 14:
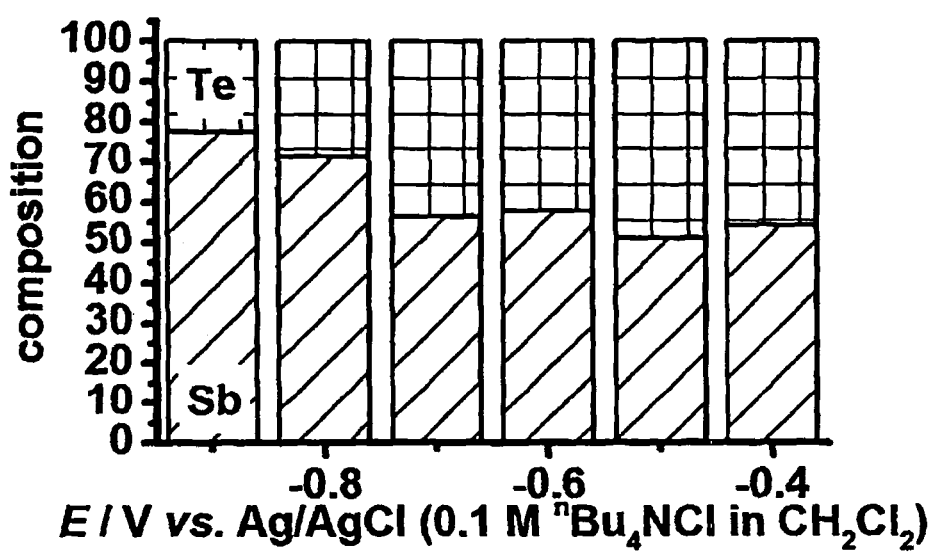
FIG. 14 shows the potential-dependent Sb:Te ratio determined by energy dispersive X-ray analysis for the antimony telluride electrodeposited as described in Example 3.

Varying the relative concentrations of the antimony and indium halometallate salts as described in Example 3, allows the composition of the electrodeposited antimony telluride material to be varied as shown in FIG. 14. However, it is desirable to be able to control the morphology of the electrodeposited semiconductor material for certain applications.

Figure 15:
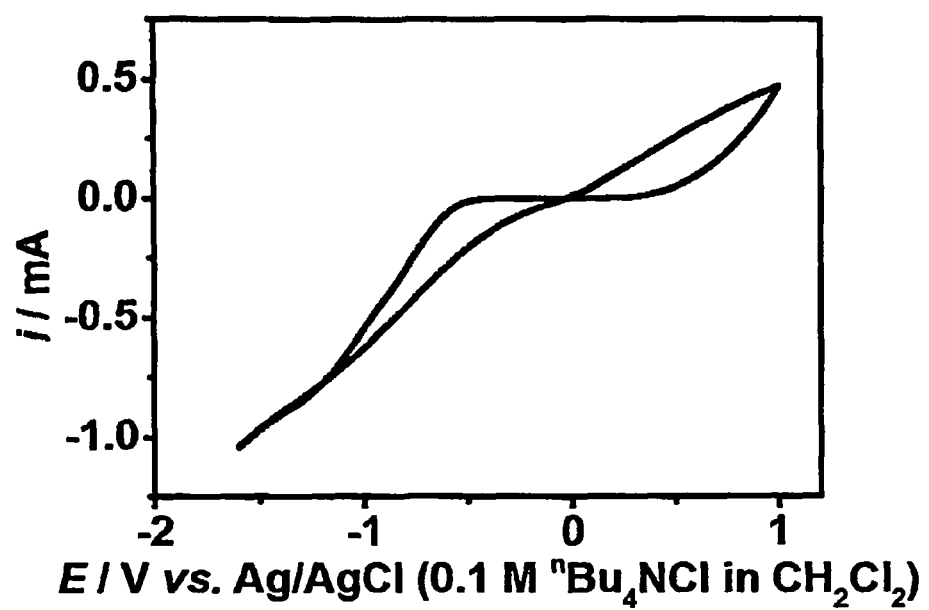
FIG. 15 shows the cyclic voltammogram of the electrochemical solution containing the precursor salts and supporting electrolyte salt dissolved in $CH_2Cl_2$ for the antimony telluride electrodeposition as described in Example 4.
Figure 16:
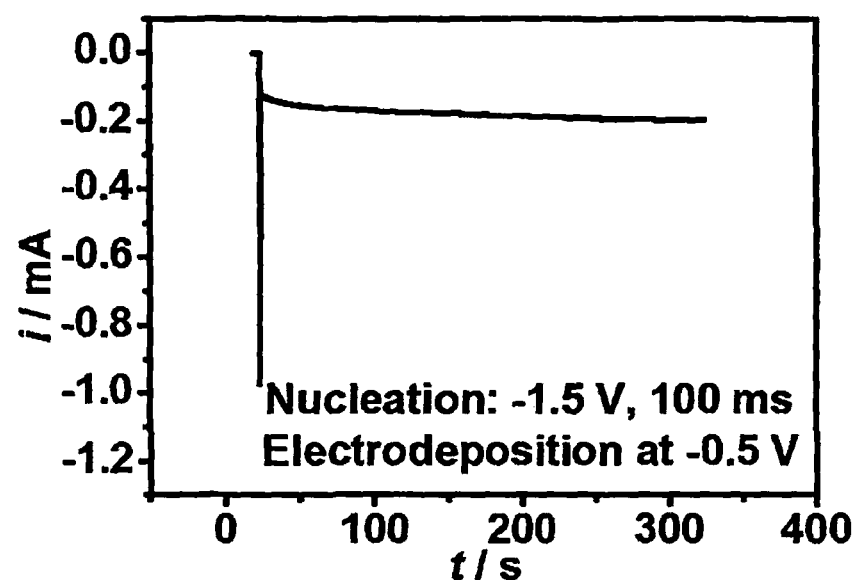
FIG. 16 shows a chronoamperometric curve of the electrochemical solution containing the precursor salts and supporting electrolyte salt dissolved in $CH_2Cl_2$ for the antimony telluride electrodeposition as described in Example 4.
Figure 17:
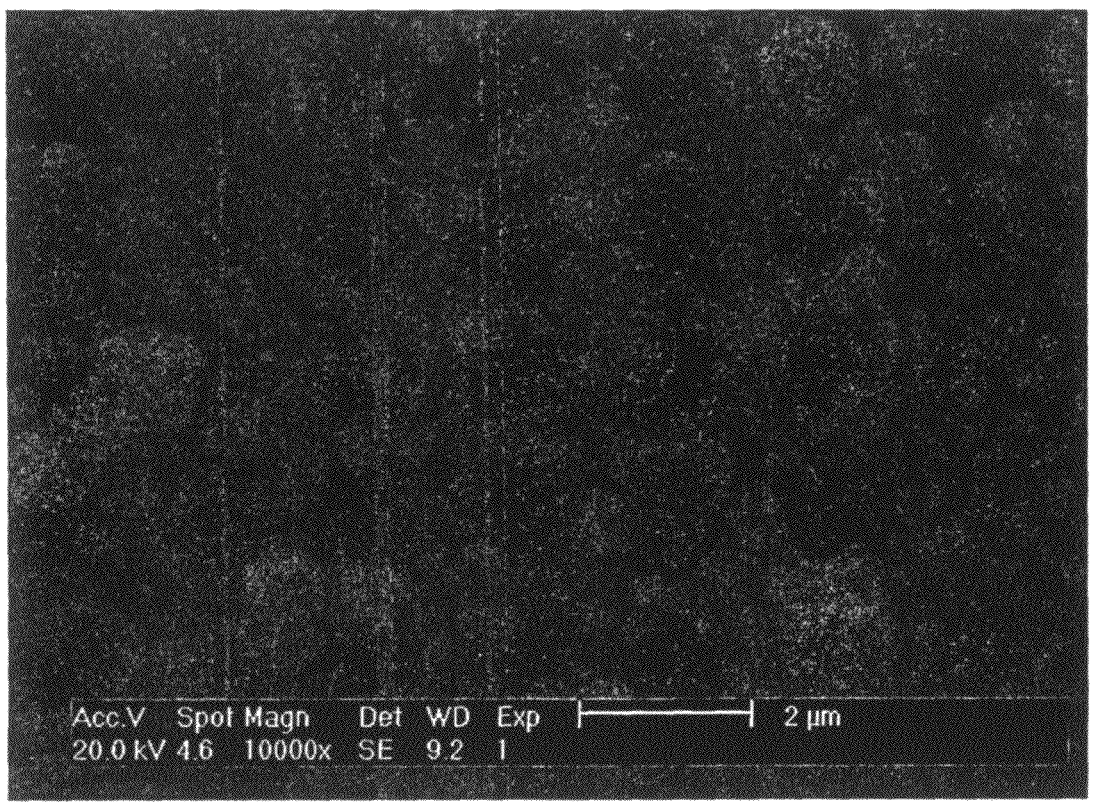
FIG. 17 shows a scanning electron micrograph of a 10000× magnification of an area of the antimony telluride electrodeposited onto TiN as described in Example 4.
Figure 18:
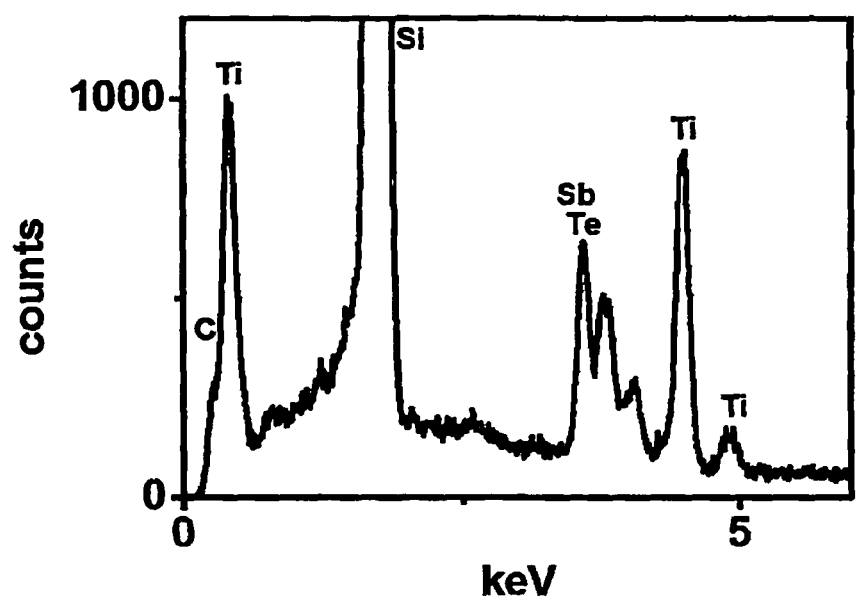
FIG. 18 shows the energy dispersive X-ray spectrum of the antimony telluride electrodeposited as described in Example 4 and shown in FIG. 17.

In Example 4 the concentrations of the halometallate salts in the electrochemical system were fixed. The cyclic voltammogram and chronoamperometry of this solution are shown in FIGS. 15 and 16 respectively. Then, in order to improve the morphology of the semiconductor material, electrodeposition was carried out by first applying a nucleation pulse step, where the electrode was held at −1.5 V vs Ag/AgCl (0.1 M Cl−, $CH_2Cl_2$) for 100 ms, before it was switched to −0.5 V vs Ag/AgCl (0.1 M Cl−, $CH_2Cl_2$), where the film was grown. The nucleation step allowed the formation of a layer of dense nuclei which were subsequently grown into films consisting of hundreds of nanometer-sized particles as shown in FIG. 17, where it can also be seen that the coverage of the electrode is much higher. FIG. 18 shows that this material contains antimony and tellurium.

Figure 19:
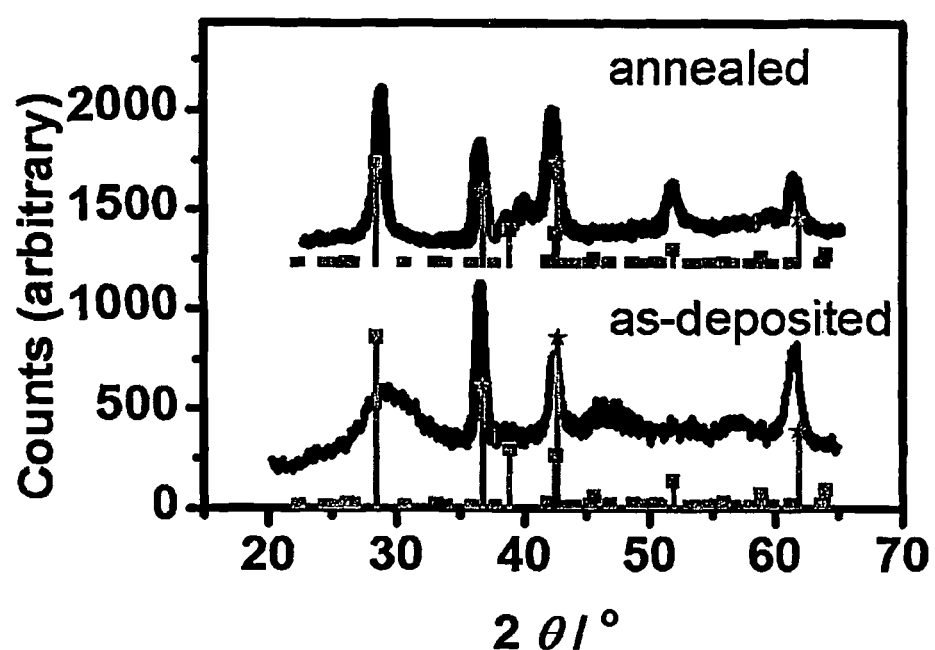
FIG. 19 shows the X-ray diffraction pattern of the antimony telluride electrodeposited as described in Example 4, (a) before and (b) after annealing at 250° C.

In FIG. 19 it can be seen that the electrodeposited antimony telluride can be crystallised by annealing the sample under $N_2$ at 250° C. The diffraction peaks present before annealing correspond to the TiN electrode, with some additional broad features evident. The latter sharpen on annealing, consistent with crystallisation, as the diffraction pattern resulting from these new peaks correspond to the pattern for antimony telluride.

Figure 20:
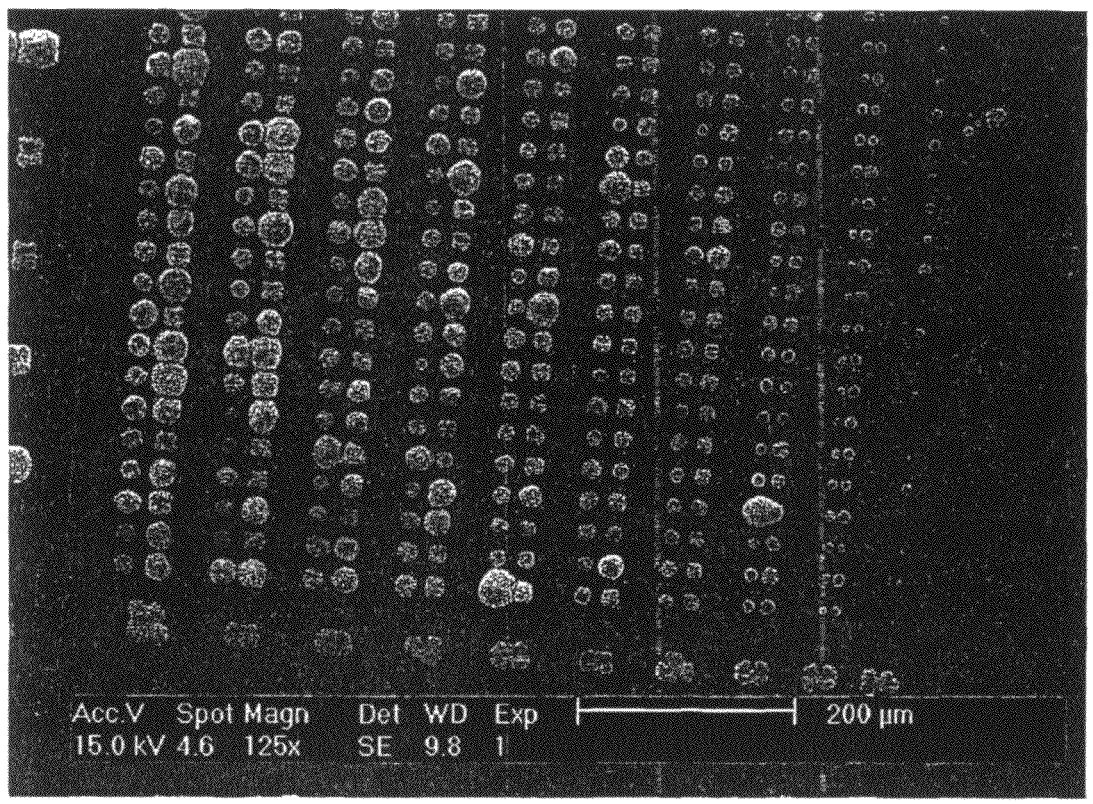
FIG. 20 shows a 125× magnification of an area of the patterned TiN electrode with hole sizes between 10 and 1 μm containing antimony telluride deposited as described in Example 5.
Figure 21:
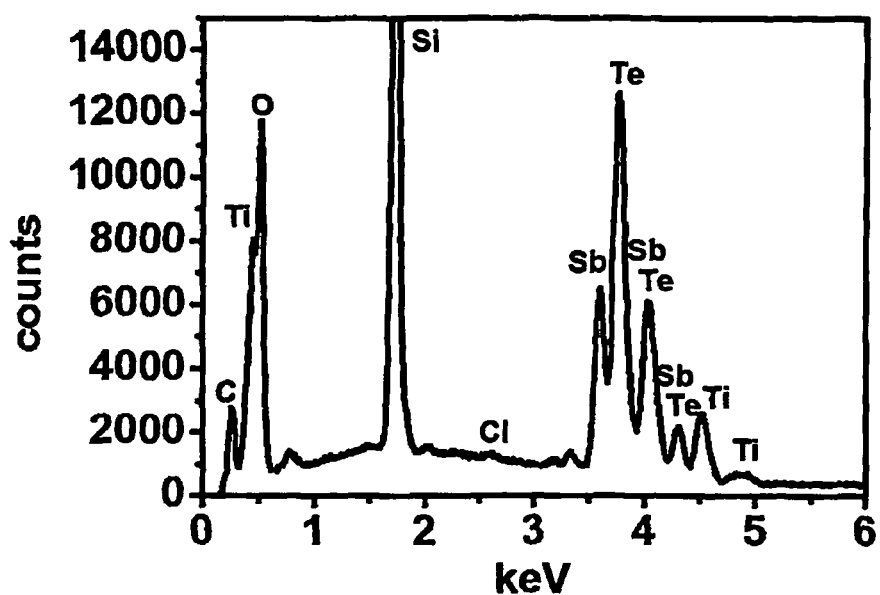
FIG. 21 shows the energy dispersive X-ray spectrum corresponding to the antimony telluride semiconductor material deposited as described in Example 5.

In FIG. 20, it can be seen that the electrodeposited antimony telluride semiconductor material using the conditions described in Example 5 can be electrodeposited into the conducting TiN regions to fill the 1-10 micron diameter holes on a patterned electrode, and without deposition occurring on the $SiO_2$ regions. Referring to FIG. 21, it can be seen from the energy dispersive X-ray analysis that after electrodeposition, this patterned electrode shows peaks corresponding to Sb and Te as well as the substrate.

Figure 22:
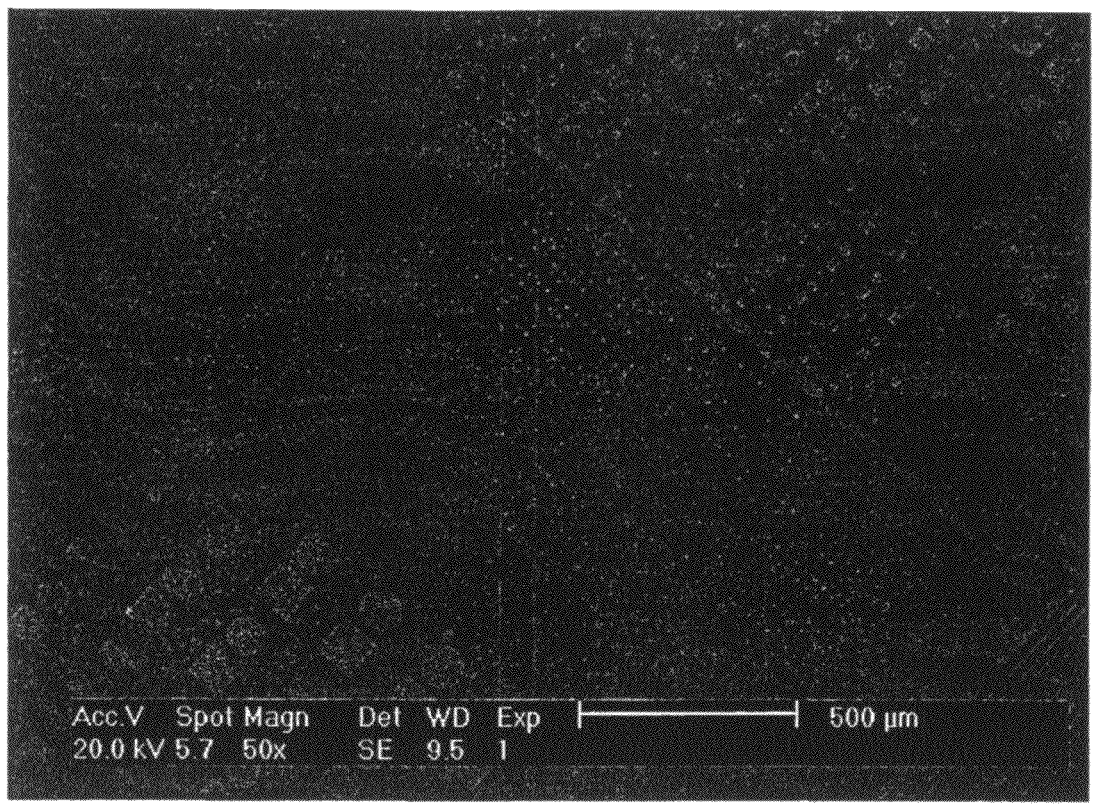
FIG. 22 shows the scanning electron micrograph of the antimony telluride semiconductor material deposited into 1 to 100 micron diameter holes as described in Example 6.
Figure 23:
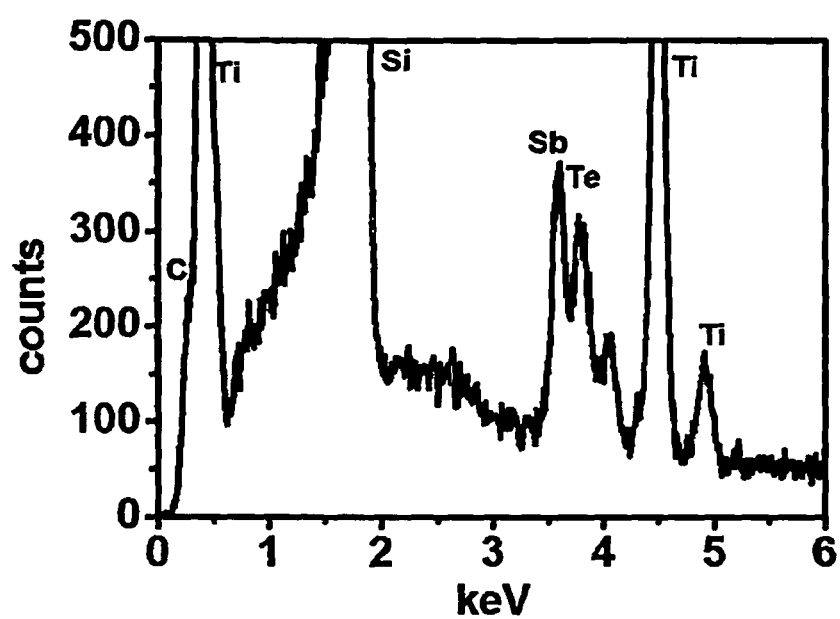
FIG. 23 shows the energy dispersive X-ray analysis scanning of the antimony telluride semiconductor material deposited into 1-10 micron diameter holes as described in Example 6.
Figure 24:
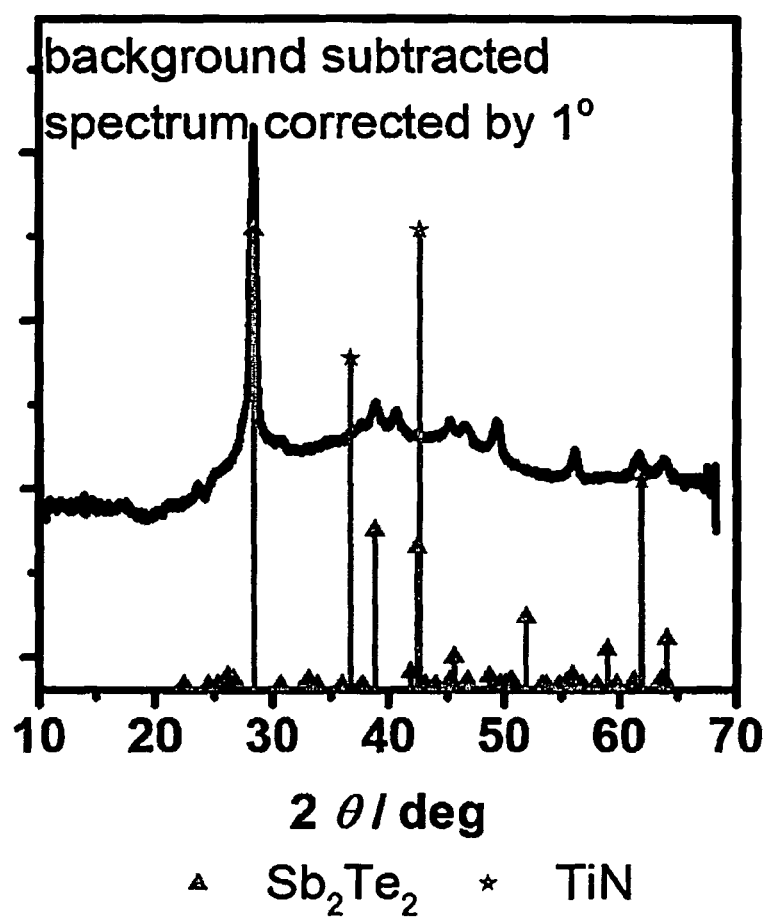
FIG. 24 shows the microfocus X-ray diffraction pattern for the antimony telluride semiconductor material deposited into 100 micron diameter holes as described in Example 6, after annealing at 160° C. for 15 min; a background spectrum was subtracted and the spectrum was shifted by 2θ=1°.

From FIGS. 22 and 23 it can be seen that the electrodeposition of antimony telluride into the micropatterned substrate can be improved by adjusting the relative concentrations of the halometallate salts in the electrochemical system and by adjusting the potential waveform, leading to more uniform filling of the TiN regions on the patterned electrode. Referring to FIG. 24, it can be seen from the microfocus X-ray diffraction data that the antimony telluride on the patterned electrode can be crystallised by annealing at 160° C. for 15 min under $N_2$ and that the diffraction pattern for the material obtained under these conditions is consistent with $Sb_2Te_2$.

Figure 25:
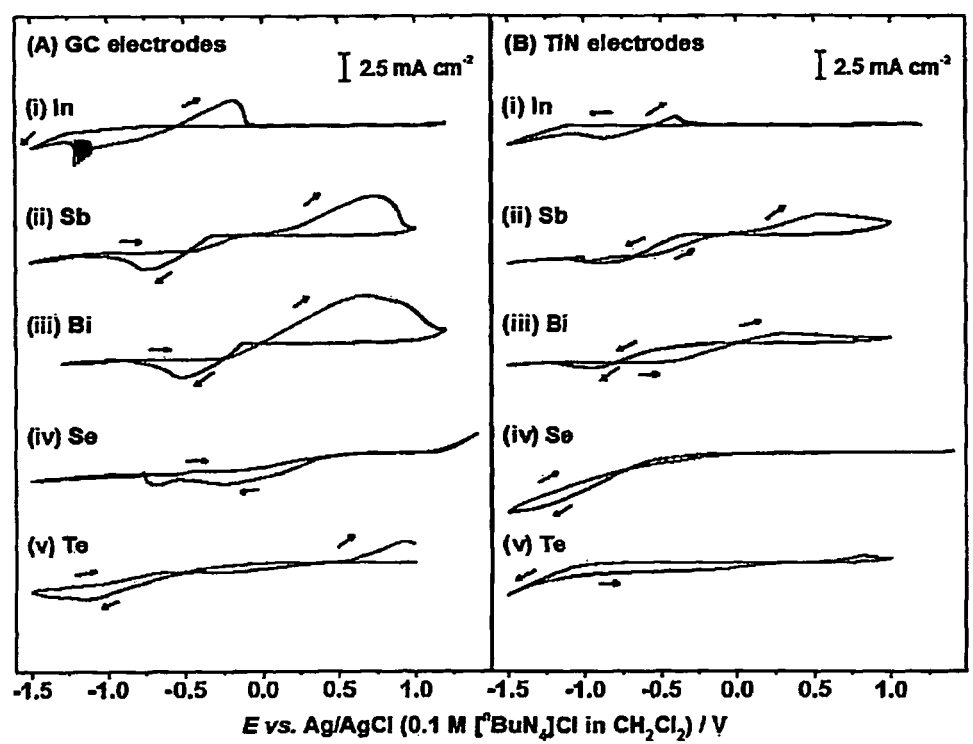
FIG. 25 shows the cyclic voltammograms for the electrochemical solutions described in Examples 7, 8, 9, 11 and 12 using (a) glassy carbon (GC) and (b) TiN electrodes.
Figure 26:
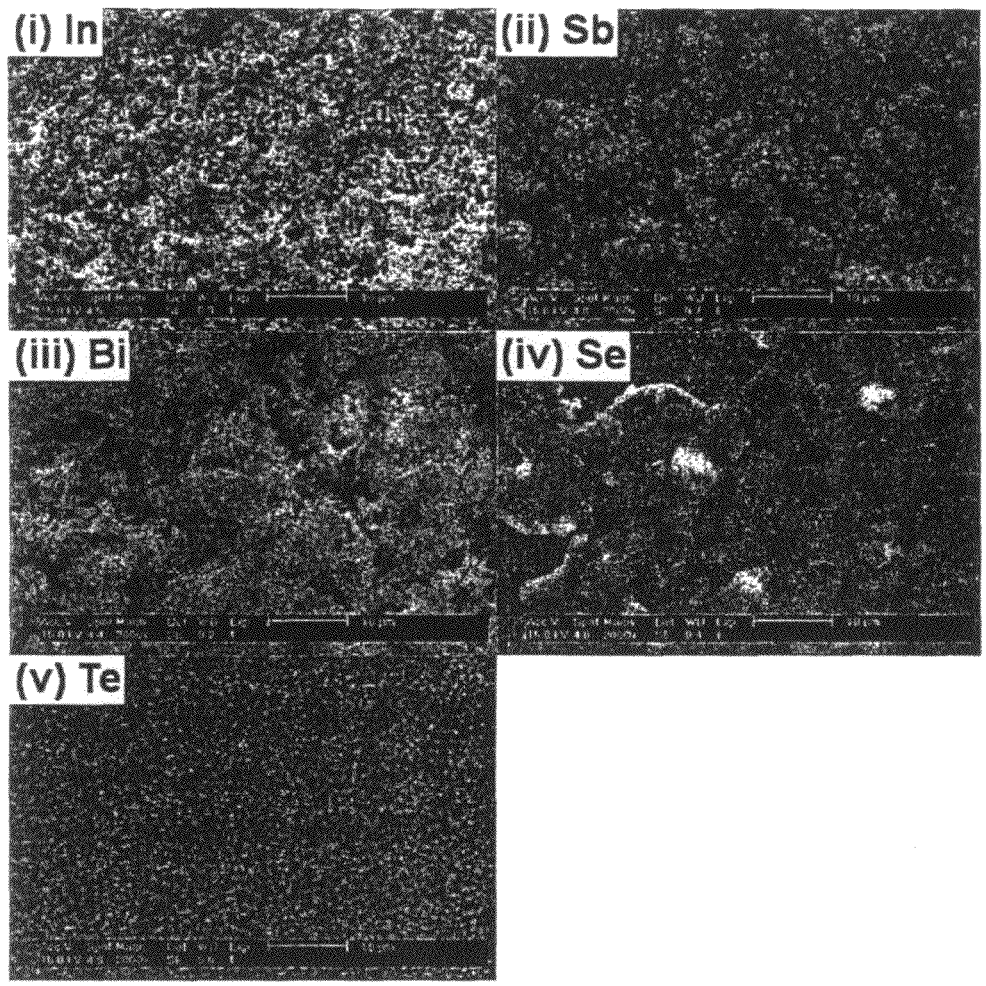
FIG. 26 shows the scanning electron micrographs from the elemental indium, antimony, tellurium, bismuth and selenium electrodeposited on TiN electrodes using the reagents and electrochemical conditions as described in Examples 7, 8, 9, 11 and 12.
Figure 27:
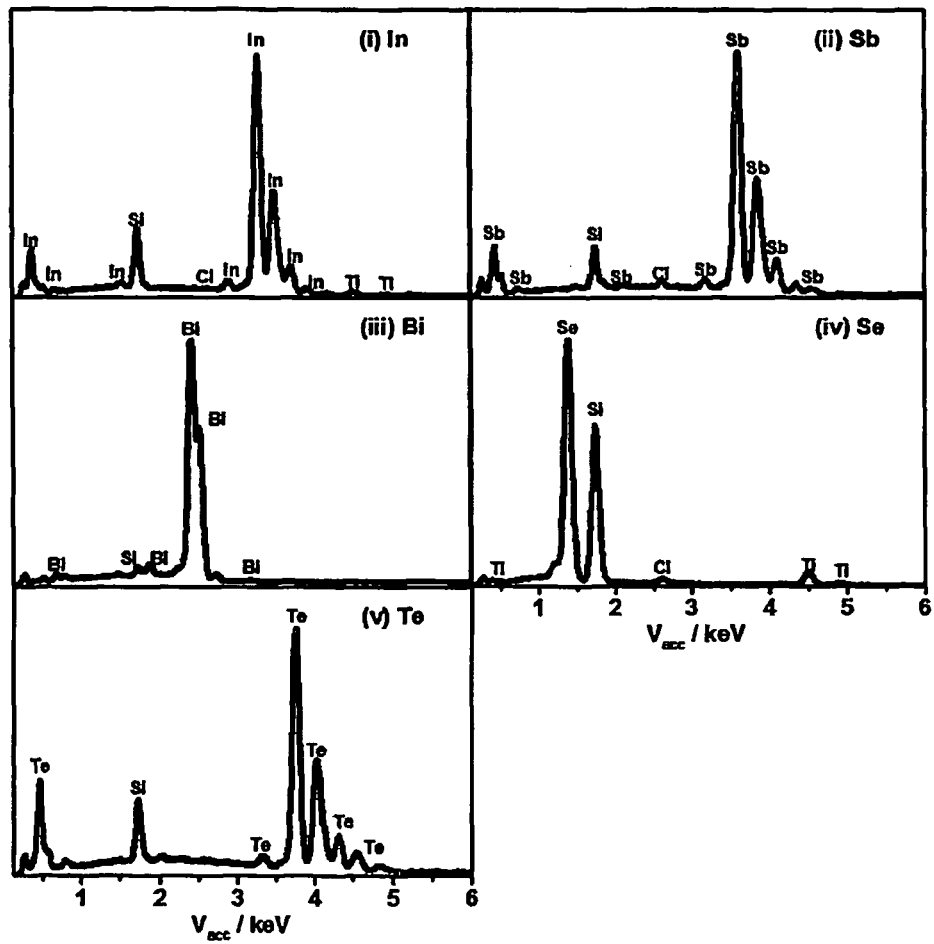
FIG. 27 shows the energy dispersive X-ray analyses from the elemental indium, antimony, tellurium, bismuth and selenium electrodeposited on TiN electrodes using the reagents and electrochemical conditions as described in Examples 7, 8, 9, 11 and 12.
Figure 28:
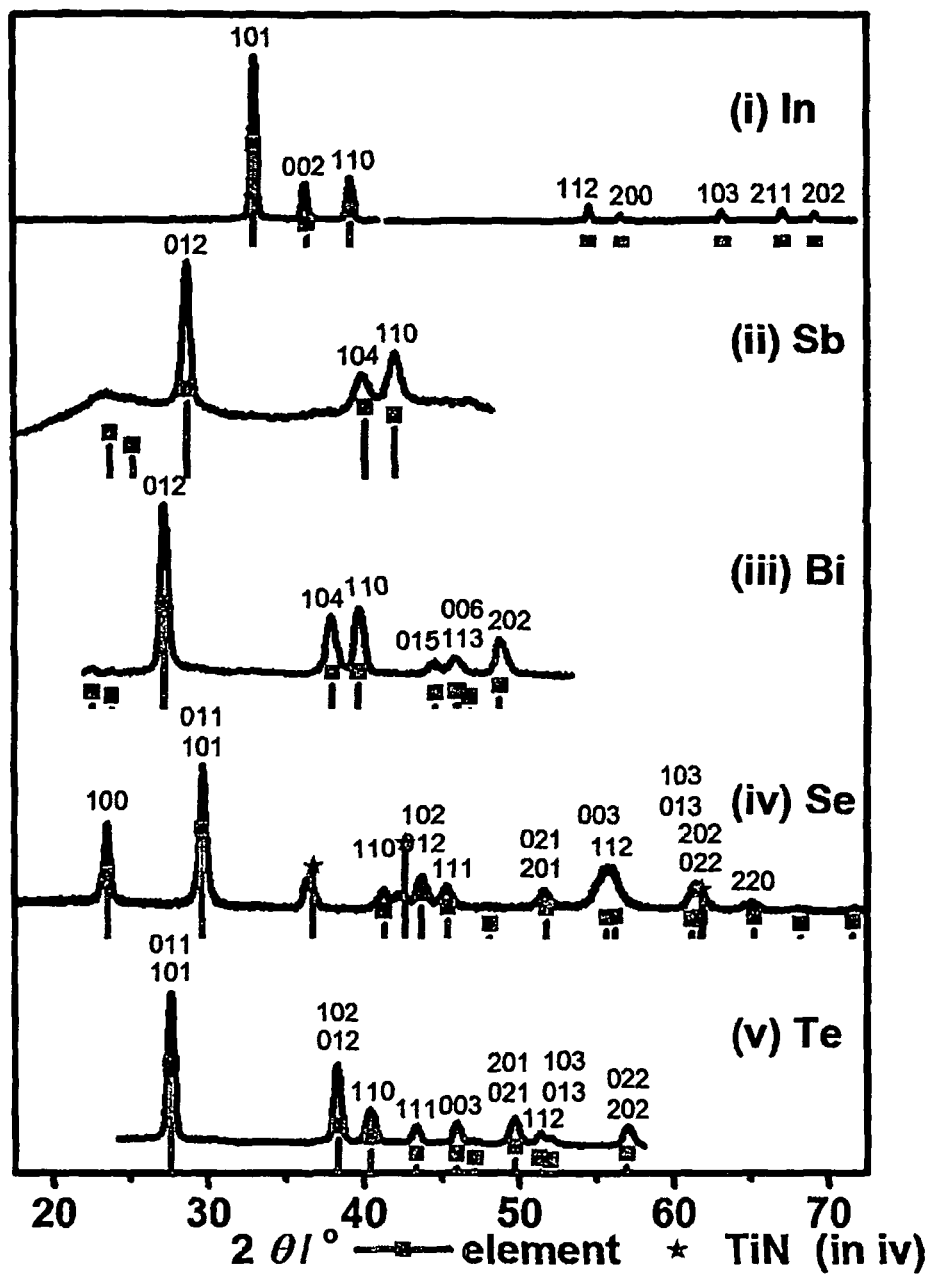
FIG. 28 shows the X-ray diffraction patterns from the elemental indium, antimony, tellurium, bismuth and selenium electrodeposited on TiN electrodes using the reagents and electrochemical conditions as described in Examples 7, 8, 9, 11 and 12.

FIG. 25 shows the cyclic voltammograms obtained using both glassy carbon and TiN electrodes from solutions of each of the halometallate salts described in Examples 7, 8, 9, 11 and 12, which were used to establish their suitability as reagents for electrodeposition of the individual elements. Scanning electron micrographs of the electrodeposited elements obtained as described in Examples 7, 8, 9, 11 and 12 show the different morphologies obtained under the conditions described as shown in FIG. 26. It is expected that the morphology and density of the electrodeposited materials can be altered by varying the potential waveforms. With regard to FIG. 27, it can be seen from the energy dispersive X-ray analyses that each of the individual elements, indium, antimony, bismuth, selenium and tellurium can be electrodeposited as pure materials from the appropriate halometallate salt, with very little Cl. FIG. 28 shows that the individual elements electrodeposited are crystalline, and match well with the diffraction patterns from the bulk elements. It is expected that the morphology, purity and density of the electrodeposited materials can be further optimised by varying the potential waveforms.

Figure 29:
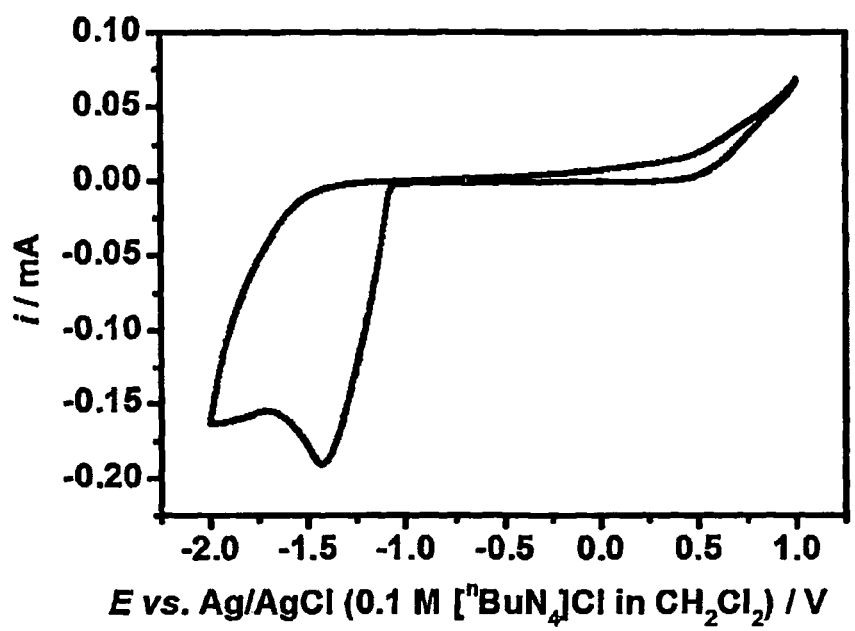
FIG. 29 shows the cyclic voltammogram from the electrochemical solution containing the precursor salt described in Example 14 and the supporting electrolyte salt dissolved in $CH_2Cl_2$ and using a glassy carbon working electrode.

It is highly desirable to be able to deposit germanium from an electrochemical system. However, germanium is known to be a difficult element to obtain in this way. This is due to both the tendency to incorporate oxygen into the electrodeposited material, forming germanium oxide impurities that severely compromise the properties of the semiconductor, and the sensitivity of many germanium-containing reagents to water and oxygen. Two halogermanate salts are described, one (Example 13) containing germanium(IV) and the other (Example 14) containing germanium(II). FIG. 29 shows the cyclic voltammogram obtained from a $CH_2Cl_2$ solution containing [″$Bu_4N$][$GeCl_3$] with [″$Bu_4N$]Cl (Example 14), revealing a significant reduction wave at around −1.4 V vs Ag/AgCl (0.1 M Cl−, $CH_2Cl_2$) This is significantly less negative than for the germanium(IV) reagent described in Example 13, suggesting that the lower oxidation state in Example 14 may be advantageous.

Figure 30:
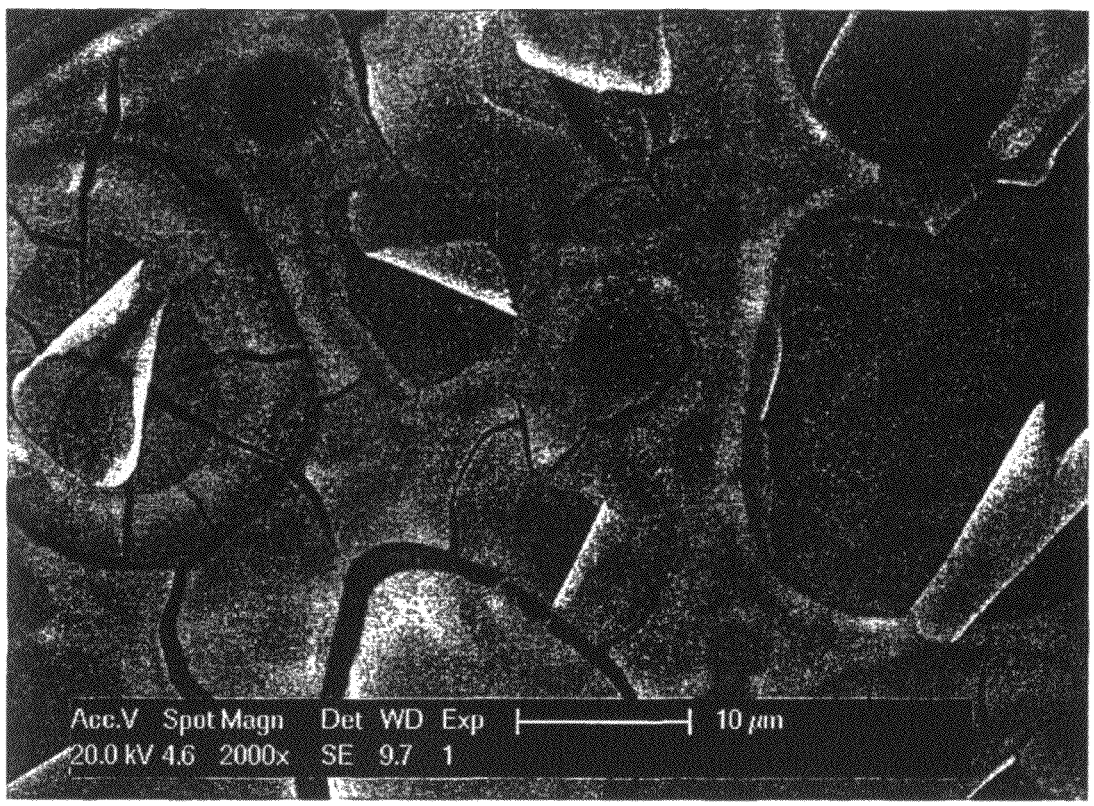
FIG. 30 shows the scanning electron micrograph at 2000× magnification of the elemental germanium electrodeposited on TiN at −1.4 V vs Ag/AgCl (0.1 M Cl$^-$, $CH_2Cl_2$) for 7200 s using the reagent described in Example 14.
Figure 31:
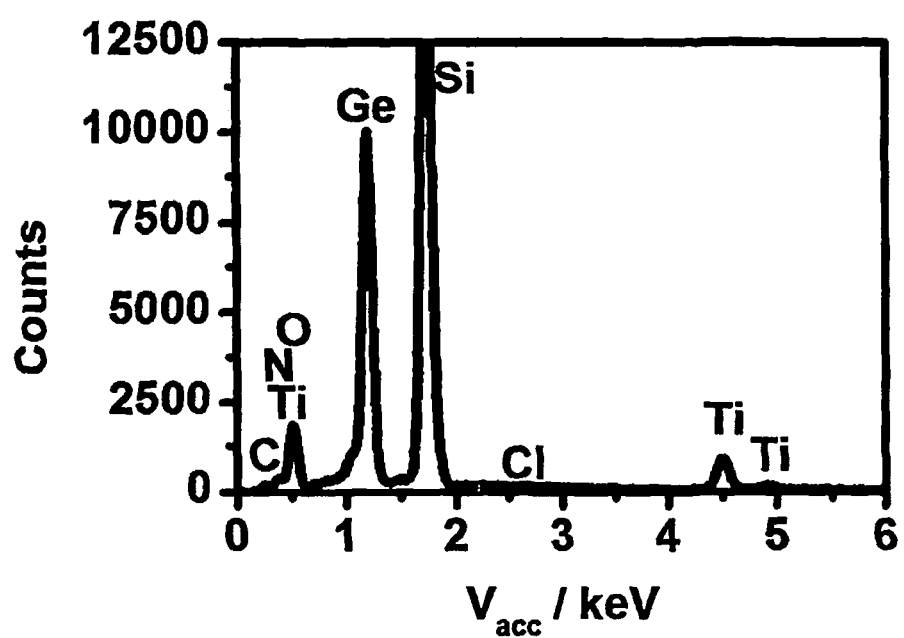
FIG. 31 shows energy dispersive X-ray analysis of the elemental germanium electrodeposited on TiN using the reagent described in Example 14 and after annealing at 600° C. for 2 hours.

Referring to FIG. 30, it can be seen from the scanning electron micrograph that electroreduction at a potential at −1.4 V vs Ag/AgCl (0.1 M Cl−, $CH_2Cl_2$) under the conditions described in Example 14, leads to deposition of a thin film of material on the electrode surface. The energy dispersive X-ray analysis of this material shown in FIG. 31 shows that the only significant elements present are the electrode materials and a strong peak due to germanium.

Figure 32:
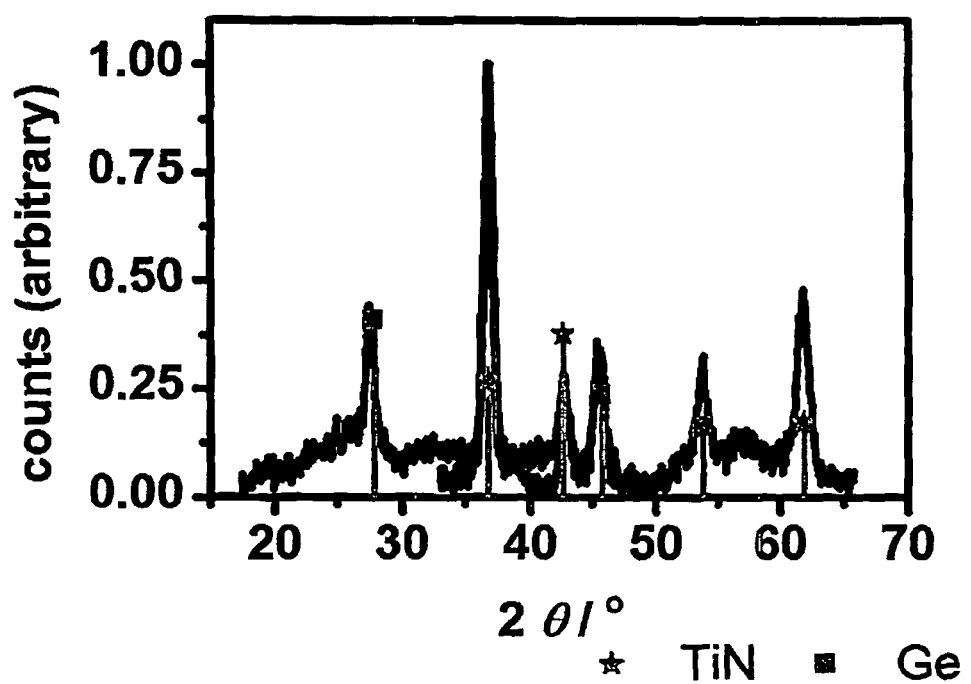
FIG. 32 shows an X-ray diffraction pattern obtained from the elemental germanium electrodeposited on TiN using the reagent described in Example 14 and after annealing at 600° C. for 2 hours.

X-ray diffraction studies on the material on the electrode surface seen in FIG. 30 shows that germanium is amorphous, However, it can be shown from FIG. 32 that the germanium can be crystallised by annealing at 600° C. under $N_2$, and that the diffraction pattern is consistent with elemental germanium.

Figure 33:
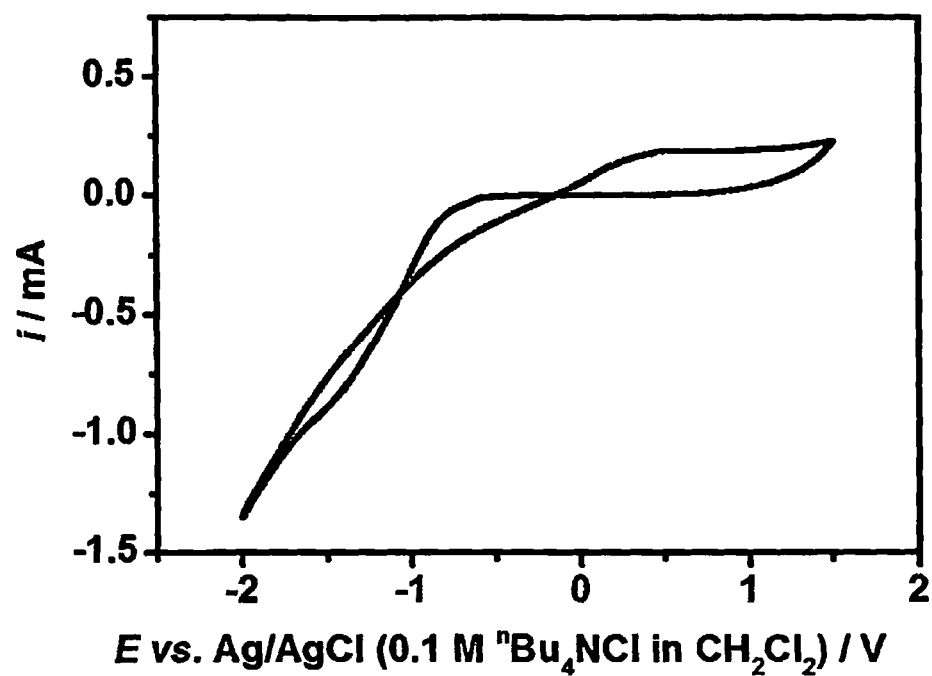
FIG. 33 shows the cyclic voltammogram from the electrochemical solution containing the precursor salts and supporting electrolyte dissolved in $CH_2Cl_2$ using a TiN working electrode for electrodeposition of a ternary germanium antimony telluride semiconductor material as described in Example 15.

FIG. 33 shows the cyclic voltammogram obtained from the electrochemical system containing the three halometallate salts containing germanium, antimony and tellurium. This example was undertaken to establish whether it would be possible to electrodeposit a ternary germanium antimony telluride material using the electrochemical system as described in Example 15. It can be seen from FIG. 34 that electrodeposition at −1.75 V vs Ag/AgCl (01 M Cl−, $CH_2Cl_2$) for 120 s leads to deposition of the electrode with almost spherical particles. The energy dispersive X-ray analysis of this material is shown in FIG. 35, which shows that the deposited material does contain germanium, antimony and tellurium, with the only other significant peaks being from the electrode substrate.

X-ray diffraction studies on the material illustrated in FIG. 34 show that it is amorphous. It can be seen from FIG. 36 that this germanium antimony telluride material can be crystallised by annealing under $N_2$ at 250° C. for 30 mins.

It can be seen from the scanning electron micrograph shown in FIG. 37 that the ternary germanium antimony telluride semiconductor material can be selectively electrodeposited on the TN regions of a patterned electrode, allowing pores with 1-3 μm diameter to be filled with the ternary alloy.

It is expected that the relative ratios of Ge:Sb:Te on flat electrodes and on patterned electrodes can be adjusted by varying the concentrations of the halometallate salts in the electrochemical system and also by varying the potential waveform, as shown for the binary antimony telluride semiconductor material described in Examples 3 and 4. Further, it is expected that the morphology of the electrodeposited material can be optimised by changing the potential waveform, as described in Example 4 for the antimony telluride material. It can also be expected that combining different halometallate salts using this electrodeposition method will allow a wide range of other elemental, binary, ternary and doped semiconductor materials to be obtained.

It is to be appreciated that the Examples and drawings have been given for the purposes of illustration only and that modifications may be made. Individual parts of the Examples and drawings are not limited to use in their Examples and drawings, and they may be used in other Examples and other drawings, and in all aspects of the invention.

The invention claimed is:

1. A process for the electrochemical deposition of a semiconductor material, which process comprises:
   (i) providing a non-aqueous solvent;
   (ii) providing at least one precursor salt which comprises a halometallate anion salt wherein a metal in the halometallate is Al, Ga, In, Ge, Sn, Pb, As, Sb, Bi, Se, Te, Cd or Hg and which forms a source of the constituent elements within the semiconductor material to be deposited; and
   (iii) electrodepositing the semiconductor material onto an electrode substrate using the precursor salt in the non-aqueous solvent,
   characterised in that:
   (iv) the semiconductor material is a p-block or a post-transition metal semiconductor material containing at least one p-block element or post-transition metal; and
   (v) the non-aqueous solvent is a halocarbon non-aqueous solvent.

2. A process according to claim 1 in which the halocarbon non-aqueous solvent is a fluoroalkane, a chloroalkane or a bromoalkane.

3. A process according to claim 1 in which the halocarbon non-aqueous solvent is dichloromethane, chloroform, difluoromethane, trifluoromethane, 1,1-dichloroethane, 1,2-dichloroethane, 1,1,1-trichloroethane or 1,1,2-trichloroethane.

4. A process according to claim 1 in which the halocarbon non-aqueous solvent is a fluoro-, chloro- or bromo-benzene, fluorotoluene or o-, m- or p-fluorotoluene.

5. A process according to claim 1 in which the halometallate anion is a chlorometallate anion, a bromometallate anion, or an iodometallate anion.

6. A process according to claim 5 in which the halometallate anion salt has the general formula:

$$[\text{cation}]_x[M_zX_y]$$

where x =1, 2 or 3
z =1 and then y =3, 4, 5 or 6
z =2 and then y =8, 9 or 10
M =Hg, Cd, Al, Ga, In, Ge, Sn, Pb, As, Sb, Bi, Se or Te and
X=Cl, Br or I.

7. A process according to claim 6 in which:
$[M_zX_y]=$
   $[AlX_4]^-$
   $[InX_4]^-$
   $[GeX_5]^-$
   $[SbX_4]^-$
   $[BiX_4]^-$
   $[SbCl_6]^-$
   $[SeX_6]^{2-}$
   $[TeX_6]^{2-}$
   $[GaX_4]^-$
   $[GeX_6]^{2-}$
   $[GeX_3]^-$
   $[SnX_6]^{2-}$
   $[SnX_5]^-$
   $[SnX_3]^-$
   $[PbX_3]^-$
   $[PbX_6]^{2-}$
   $[AsX_4]^-$
   $[SbX_5]^{2-}$
   $[SbX_6]^{3-}$
   $[BiX_5]^{2-}$
   $[BiX_6]^{3-}$
   $[Sb_2X_8]^{2-}$
   $[Bi_2X_8]^{2-}$
   $[Se_2X_{10}]^{2-}$
   $[Te_2X_{10}]^{2-}$
   $[CdX_4]^{2-}$
   $[CdX_5]^{3-}$
   $[HgX_4]^{2-}$
   $[HgX_5]^{2-}$
   $[HgX_3]^-$.

8. A process according to claim 1 in which the precursor salt contains a redox inactive cation.

9. A process according to claim 8 in which the redox inactive cation in the precursor salt is a quaternary ammonium cation having a group $[R_4N]^+$ where R =alkyl.

10. A process according to claim 8 in which the redox inactive cation in the precursor salt is imidazolium; alkyl substituted imidazolium, where alkyl is methyl, ethyl, propyl, butyl, pentyl, hexyl, benzyl, cyclopentyl, cyclohexyl, or mixtures thereof; pyrrolidinium; alkyl substituted pyrrolidinium where alkyl is methyl, ethyl, propyl, butyl, pentyl, hexyl, benzyl, cyclopentyl, cyclohexyl, or mixtures thereof; $[PPh_4]^+$; $[AsPh_4]^+$ or $[(PPh_3)_2N]^+$.

11. A process according to claim 1 and including providing a supporting electrolyte salt for the non-aqueous solvent.

12. A process according to claim 11 in which the supporting electrolyte salt is a redox inactive salt.

13. A process according to claim 12 in which the redox inactive salt is in the form of a cation and an anion.

14. A process according to claim 11 in which an anion in the supporting electrolyte salt is halide, tetrafluoroborate, hexafluorophosphate, a tetra-arylborate, a fluorinated tetra-arylborate, tetra-alkoxyaluminate, or a fluorinated tetra-alkoxyaluminate anion.

15. A process according to claim 11 in which a cation in the supporting electrolyte salt is a redox inactive quaternary ammonium cation salt having a group $[R_4N]^+$ where R=alkyl.

16. A process according to claim 1 in which the electrodeposition is a continuous electrodeposition or a pulsed electrodeposition.

17. A process according to claim 1 in which the electrode substrate is an electrode substrate having insulating pores, in which the semiconductor material is deposited as a shaped structure, in which the shaped structure is a plurality of pillars, and in which the pillars are electrodeposited in the insulating pores.

18. A process according to claim 1 in which the semiconductor material is electrodeposited all over the electrode substrate, the electrode substrate being a flat electrode substrate.

19. A process according to claim 1 in which the semiconductor material is a compound semiconductor containing two or more p-block elements, a single semiconductor element or a semiconductor alloy.

* * * * *